(12) United States Patent
Darwish

(10) Patent No.: US 8,058,682 B2
(45) Date of Patent: Nov. 15, 2011

(54) SEMICONDUCTOR DEVICE

(75) Inventor: Mohamed N. Darwish, Campbell, CA (US)

(73) Assignee: MaxPower Semiconductor Inc., Santa Clara, CA (US)

( * ) Notice: Subject to any disclaimer, the term of this patent is extended or adjusted under 35 U.S.C. 154(b) by 770 days.

(21) Appl. No.: 11/971,096

(22) Filed: Jan. 8, 2008

(65) Prior Publication Data

US 2008/0191307 A1    Aug. 14, 2008

Related U.S. Application Data

(60) Provisional application No. 60/879,434, filed on Jan. 9, 2007.

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. ........................................ 257/328; 257/341

(58) Field of Classification Search .......... 257/328–346, 257/E21.418, E29.183
See application file for complete search history.

(56) References Cited

U.S. PATENT DOCUMENTS

| | | |
|---|---|---|
| 5,216,275 A | 6/1993 | Chen |
| 5,282,018 A | 1/1994 | Hiraki et al. |
| 5,637,898 A | 6/1997 | Baliga |
| 5,767,548 A | 6/1998 | Wondrak et al. |
| 5,864,159 A | 1/1999 | Takahashi |
| 5,973,359 A | 10/1999 | Kobayashi |
| 5,998,833 A | 12/1999 | Baliga |
| 6,040,600 A | 3/2000 | Uenishi et al. |
| 6,069,372 A | 5/2000 | Uenishi |
| 6,078,090 A | 6/2000 | Williams et al. |
| 6,114,727 A | 9/2000 | Ogura et al. |
| 6,184,555 B1 | 2/2001 | Tihany et al. |
| 6,191,447 B1 | 2/2001 | Baliga |
| 6,201,291 B1 | 3/2001 | Kordic et al. |
| 6,251,730 B1 | 6/2001 | Luo |
| 6,388,286 B1 | 5/2002 | Baliga |

(Continued)

FOREIGN PATENT DOCUMENTS

EP    0325161 A2    7/1989

(Continued)

OTHER PUBLICATIONS

Grant et al., *Power MOSFETS Theory and Applications*, John Wiley & Sons Ltd., 1989, p. 68-74.

(Continued)

*Primary Examiner* — Cuong Q Nguyen

(57) ABSTRACT

A semiconductor structure includes a number of semiconductor regions, a pair of dielectric regions and a pair of terminals. The first and second regions of the structure are respectively coupled to the first and second terminals. The third region of the structure is disposed between the first and second regions. The dielectric regions extend into the third region. A concentration of doping impurities present in the third region and a distance between the dielectric regions define an electrical characteristic of the structure. The electrical characteristic of the structure is independent of the width of the dielectric regions width. The first and second regions are of opposite conductivity types. The structure optionally includes a fourth region that extends into the third region, and surrounds a portion of the pair of dielectric regions. The interface region between the dielectric regions and the fourth region includes intentionally introduced charges.

47 Claims, 19 Drawing Sheets

U.S. PATENT DOCUMENTS

| | | | |
|---|---|---|---|
| 6,509,233 B2 | 1/2003 | Chang et al. | |
| 6,525,373 B1 | 2/2003 | Kim | |
| 6,541,820 B1 | 4/2003 | Bol | |
| 6,608,350 B2 | 8/2003 | Kinzer et al. | |
| 6,649,975 B2 | 11/2003 | Baliga | |
| 6,677,641 B2 * | 1/2004 | Kocon | 257/329 |
| 6,686,244 B2 | 2/2004 | Blanchard | |
| 6,710,403 B2 | 3/2004 | Sapp | |
| 6,724,042 B2 | 4/2004 | Onishi et al. | |
| 6,803,627 B2 | 10/2004 | Pfirsch | |
| 6,812,525 B2 | 11/2004 | Bul et al. | |
| 7,230,310 B2 | 6/2007 | Chen | |
| 2001/0041407 A1 | 11/2001 | Brown | |
| 2003/0071616 A1 | 4/2003 | Hauenstein | |
| 2003/0203576 A1 | 10/2003 | Kitada et al. | |
| 2004/0150040 A1 | 8/2004 | Nitta et al. | |
| 2005/0032291 A1 | 2/2005 | Baliga | |
| 2006/0060916 A1 | 3/2006 | Girdhar et al. | |
| 2006/0118853 A1 | 6/2006 | Takata et al. | |
| 2006/0214222 A1 | 9/2006 | Challa et al. | |
| 2006/0267090 A1 | 11/2006 | Sapp et al. | |
| 2007/0158740 A1 | 7/2007 | Yoshikawa et al. | |

FOREIGN PATENT DOCUMENTS

| | | |
|---|---|---|
| EP | 1583152 A2 | 10/2005 |

OTHER PUBLICATIONS

Kazerounian et al., "CODMOS—A Depletion MOSFET Using Fixed Oxide Charge", 41st Annual Device Research Conference, IEEE Electron Devices Society, Jun. 20-22, 1983.

Konig et al., "The Negatively Charged Insulator-Semiconductor Structure: Concepts, Technological Considerations and Applications,". Solid State Electronics, 2000; 44(1): 111-116.

Pfiester et al., "Gain-enhanced LDD NMOS Device Using Cesium Implantation," IEEE Transactions on Electron Devices, Jun. 1992; 39(6): 1469-1476.

Watt et al., "A Low-Temperature NMOS Technology with Cesium-Implanted Load Devices" IEEE Trans. Electron Devices, 34, Jan. 1987, pp. 28-38.

International Search Report and Written Opinion of PCT Application No. PCT/US08/50505, dated Jul. 7, 2008, 17 pages total.

J. T. Watt, B. J. Fishbein & J. D. Plummer; Low-Temperature NMOS Technology with Cesium-Implanted Load Devices; IEEE Trans. Electron Devices, vol. 34, # 1, Jan.'87; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan.'89; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun.'92; p. 1469-1476.

International Search Report and Written Opinion mailed Jul. 2, 2008 for PCT/US 08/50532 filed Jan. 8, 2008.

* cited by examiner

SEMICONDUCTOR DEVICE

CROSS-REFERENCES TO RELATED APPLICATIONS

The present application claims benefit under 35 U.S.C. §119(e) of U.S. Provisional Patent Application No. 60/879,434, filed Jan. 9, 2007, entitled "Power MOS Transistor", the content of which is incorporated herein by reference in its entirety.

BACKGROUND OF THE INVENTION

The present invention relates to electronic devices, and more particularly to a semiconductor device adapted to sustain high voltages.

In electronic systems, there is often a need to sustain a relatively high voltage across a pair of nodes. Semiconductor p-n junction diodes are widely used in a reverse-bias mode to sustain high voltages. To sustain a high breakdown voltage across a p-n junction, a lightly doped region is required that is relatively thick and that forms a voltage sustaining layer. Such p-n junctions provide relatively higher breakdown voltage in many semiconductor devices such as MOSFETs, IGBTs and JFETs. Moreover, such semiconductor devices are typically required to have a relatively low on-resistance (Ron) in the on-state and a relatively high breakdown voltage $V_B$ under reverse bias conditions. As is well known, achieving both a high breakdown $V_B$ and a low Ron poses a number of challenging tasks. In conventional devices, design parameters such as the doping density or layer thickness that can be used to increase the breakdown voltage causes the on-resistance to increase, and vice versa.

One known device used to achieve both a low on-resistance as well as a high breakdown voltage is commonly referred to as the SuperJunction (SJ) device. As is shown in FIG. 1, a SJ device (structure) often includes a number of alternating p-type and n-type layers or pillars that are charge balanced. In a SJ structure, it is desirable to pack as many pillars or cells in a given unit area to lower the specific on-resistance, $R_{sp}$, which is defined as Ron*A, where A is the device area.

In a SJ structure, the widths of the n-type and p-type pillars set a limit on the cell pitch and the scaling down of the structure. There are also a number of drawbacks associated with the manufacturing of a SJ structure, such as the requirement to grow multiple epitaxial layers and to perform a number of implant and diffusion steps. A need continues to exist for a semiconductor device that has a high breakdown voltage, a low $R_{sp}$, low capacitances and low reverse recovery charge (Qrr), is easily scaled down and is easier to manufacture.

SUMMARY OF THE INVENTION

A semiconductor structure, in accordance with one embodiment of the present invention, includes, in part, a number of semiconductor regions, at least a pair of dielectric regions and a pair of terminals. The first and second regions of the semiconductor structure are respectively coupled to the first and second terminals. The third region of the semiconductor structure is of a single conductivity type and is disposed between the first and second regions. The dielectric regions extend into the third region. A concentration of doping impurities present in the third region and a distance between the dielectric regions define an electrical characteristic of the semiconductor structure. The electrical characteristic of the semiconductor structure is independent of the width of the dielectric regions width. The first and second regions are of opposite conductivity types.

In one embodiment, the dielectric regions extend into the first and second regions. In one embodiment, the integrated density of doping impurities in the third region along a line parallel to a surface of the dielectric regions ranges from about $1 \times 10^{12}/cm^2$ to about $5 \times 10^{12}/cm^2$. In one embodiment, each dielectric region further includes a second material. In one embodiment, the second material in each dielectric region includes, in part, aluminum fluoride. In one embodiment, each dielectric region further includes, in part, a third material that is a dielectric material. In one embodiment, the second and third materials in each dielectric region are the same material.

In one embodiment, the first and second regions are respectively p+ type and n+ type regions, and the first and second terminals are respectively anode and cathode terminals. In one embodiment, the third region is a p-type region. In another embodiment, the third region is an n-type region. In one embodiment, the third region is formed above the second region, and said first region is formed above the third region. In one embodiment, the dielectric regions are isolated from one another.

In one embodiment, the semiconductor structure further includes, in part, a fourth region disposed between the second and the third regions. The second and fourth regions are of the same conductivity type.

In one embodiment, the first and second regions are respectively n+ type and p+ type regions, and the first and second terminals are respectively cathode and anode terminals. In one embodiment, the third region is a p-type region. In another embodiment, the third region is an n-type region. In one embodiment, the third region is formed above the second region, and the first region is formed above the third region. In one embodiment, the third region is formed above the second region and the first region is formed above the third region. In one embodiment, each of the dielectric region is tapered so as to have a larger width near one end of the dielectric region than another end of the dielectric region.

In one embodiment, the first, second and third regions are formed along the same surface of a semiconductor substrate in which the semiconductor structure is formed. In one such embodiment, the semiconductor structure includes a fourth region in which the second region is formed. In one such embodiment, the third region is adjacent the first and fourth regions. In one such embodiment, the first region is a p+ type region, the second region is an n+ type region, the third region is a p-type region and the fourth region is an n-type region. In another such embodiment, the first region is a p+-type region, the second region is an n+-type region, the third region is an n-type region and the fourth region is a p-type region.

A semiconductor structure, in accordance with another embodiment of the present invention, includes, in part, a number of semiconductor regions, at least a pair of dielectric regions and a pair of terminals. The first and second regions of the semiconductor structure are respectively coupled to the first and second terminals. The third and fourth regions are disposed between and adjacent the first and second regions. The dielectric regions extend into the third region. The fourth region extends into the third region, has a conductivity type opposite a conductivity type of the third region, and surrounds a portion of the at least first and second dielectric regions. A concentration of doping impurities present in the third region and a distance between the dielectric regions define an electrical characteristic of the semiconductor structure. The electrical characteristic of the semiconductor structure is independent of the width of the dielectric regions width. The first and second regions are of opposite conductivity types. The interface region between the dielectric regions and the fourth region includes intentionally induced charges.

In one embodiment, the dielectric regions extend into the first and second regions. In one embodiment, the integrated density of doping impurities in the third region along a line parallel to a surface of the dielectric regions ranges from about $1\times10^{12}/cm^2$ to about $5\times10^{12}/cm^2$. In one embodiment, each dielectric region further includes a second material. In one embodiment, the second material in each dielectric region includes, in part, aluminum fluoride. In one embodiment, each dielectric region further includes, in part, a third material that is a dielectric material. In one embodiment, the second and third materials in each dielectric region are the same material.

In one embodiment, the first and second regions are respectively p+ type and n+ type regions, and the first and second terminals are respectively anode and cathode terminals. In one embodiment, the third region is a p-type region. In another embodiment, the third region is an n-type region. In one embodiment, the third region is formed above the second region, and said first region is formed above the third region. In one embodiment, the dielectric regions are isolated from one another.

In one embodiment, the semiconductor structure further includes, in part, a fourth region disposed between the second and the third regions. The second and fourth regions are of the same conductivity type.

In one embodiment, the first and second regions are respectively n+ type and p+ type regions, and the first and second terminals are respectively cathode and anode terminals. In one embodiment, the third region is a p-type region. In one embodiment, the third region is a p-type region. In another embodiment, the third region is an n-type region. In one embodiment, the third region is formed above the second region, and the first region is formed above the third region. In one embodiment, the third region is formed above the second region and the first region is formed above the third region. In one embodiment, each of the dielectric region is tapered so as to have a larger width near one end of the dielectric region than another end of the dielectric region.

In one embodiment, the first, second and third regions are formed along the same surface of a semiconductor substrate in which the semiconductor structure is formed. In one such embodiment, the semiconductor structure includes a fourth region in which the second region is formed. In one such embodiment, the third region is adjacent the first and fourth regions. In one such embodiment, the first region is a p+ type region, the second region is an n+ type region, the third region is a p-type region and the fourth region is an n-type region. In another such embodiment, the first region is a p+-type region, the second region is an n+-type region, the third region is an n-type region and the fourth region is a p-type region.

DETAILED DESCRIPTION OF SPECIFIC EMBODIMENTS

Figure 1:
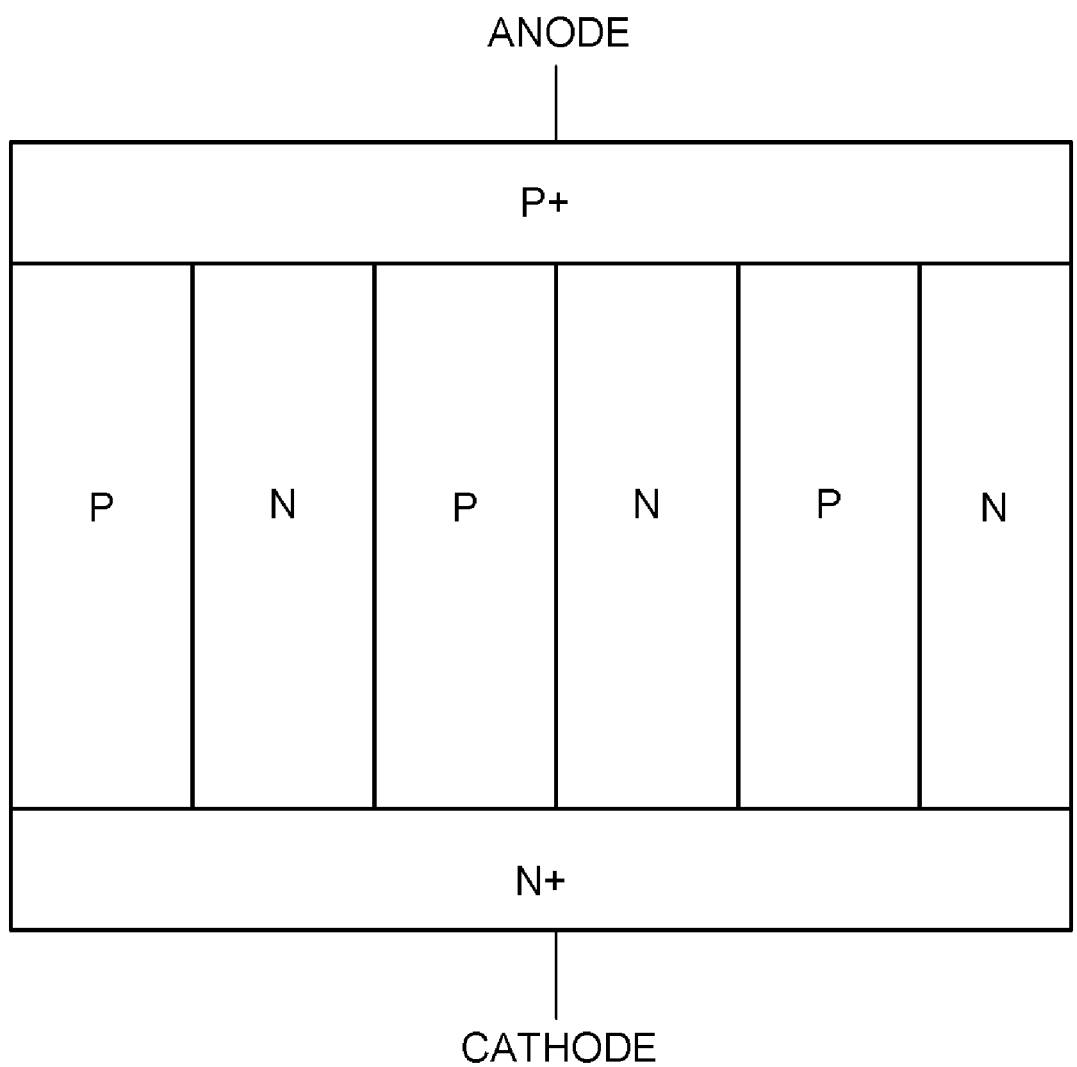
FIG. 1 is a cross-sectional view of a SuperJunction device, as known in the prior art.

A semiconductor structure, in accordance with one exemplary embodiment of the present invention, is characterized, in part, by a relatively high breakdown voltage $V_B$. The semiconductor structure includes dielectric layers that have intentionally introduced charge ($Q_f$). By alternating dielectric and silicon layers that are charge balanced, the structure sustains a higher breakdown voltage for a given voltage sustaining region doping concentration and/or thickness than conventional devices. In some embodiments, the silicon layers disposed between the dielectric layers are formed using epitaxial growth, implantation or lightly doped epitaxial growth followed by implantation, or the like. The device performance provided by embodiments of the present invention exceeds the one dimensional silicon breakdown voltage limit for the same doping and thickness of the epitaxial layer or voltage sustaining layer.

In the following description, fixed charge(s) refers to the charge intentionally introduced using processes such as ion implantation, diffusion, deposition and the like in addition to the charge that results as a by-product of fabrication processes. Furthermore, while reference is made below generally with respect to interfacial charges, i.e., charges in the interface region between the dielectric and the semiconductor region, it is understood that such charges may also be present both in the dielectric as well as in the semiconductor region in which the dielectric regions are formed.

At reverse bias, dielectric layer's charge is balanced by charges in the depletion region. At zero bias, the dielectric layer's charge is balanced, in part, by the charges present in an inversion layer that forms at the semiconductor-dielectric layer interface. The charge in the dielectric layer, in one embodiment, is located at or close to the semiconductor-dielectric interface for maximum effectiveness. In one embodiment, the charge is immobile at typical device operating temperatures. Both negative or positive charges can be used to provide the required charge to balance the depletion charge of the ionized impurities of the semiconductor layer. This results in a more uniform electric field along the voltage sustaining region and therefore a higher breakdown voltage.

The present invention provides a number of advantages over conventional semiconductor structures that depend primarily on the permittivity and width of a dielectric layer adjacent the semiconductor region. In accordance with the present invention, the fixed charge provided for charge balance is not a function of the trench width. Therefore, to achieve a higher breakdown voltage, the width of the dielectric layer is only limited by the steps needed to introduce the fixed charge and refill the trench, which enables smaller cell pitches than that which can be obtained by conventional SJ or non-SJ type structures. Furthermore, by implementing charge balance by using charges in dielectric layers and not p-n junctions or field plates, lower capacitances are achieved. The structures of the present invention as described herein are easier and more cost effective to fabricate.

Both negative or positive charges may be used to provide the required charge balance. The charge balance achieved using charges in dielectric layers, in accordance with the present invention, provides lower capacitance values than other charge balance techniques. A structure, in accordance with the present invention, is easier and more cost effective to fabricate.

In some embodiments, negative charges near the semiconductor-dielectric interface of trenches balance the positive depletion charges in the n-type semiconductor layers to sustain higher voltages. The negative dielectric charges may be generated using compound insulating layer, for example, silicon dioxide and aluminum fluoride ($AlF_3$ or $AlF_x$) or by implanting ions such as iodine, bromine, chlorine, chromium, aluminum, or other suitable ions. The negative charge generation effect using a compound insulating layer of silicon dioxide and aluminum fluoride ($AlF_3$ or $AlF_x$) has been experimentally verified where the negative interface charge was found to be a strong function of the fraction x. In yet other embodiments, positive charges near the semiconductor-dielectric interface of trenches balance the negative depletion charges in p-type semiconductor layers to sustain higher voltages. The positive charges may be generated, for example, by implanting positive ions such as cesium or potassium into the dielectric layer that is formed along the walls and the bottom of trenches. Alternatively, another dielectric layer that contains positive charges, such as silicon-nitride or silicon-oxynitride, is deposited on the dielectric layer that is formed along the walls and the bottom of trenches. Another approach of generating positive or negative charges in dielectric layers, for example oxide, is diffusion of impurities into the oxide using techniques such as vapor deposition of impurities on the oxide layer followed by a drive-in or annealing step.

Figure 2A:
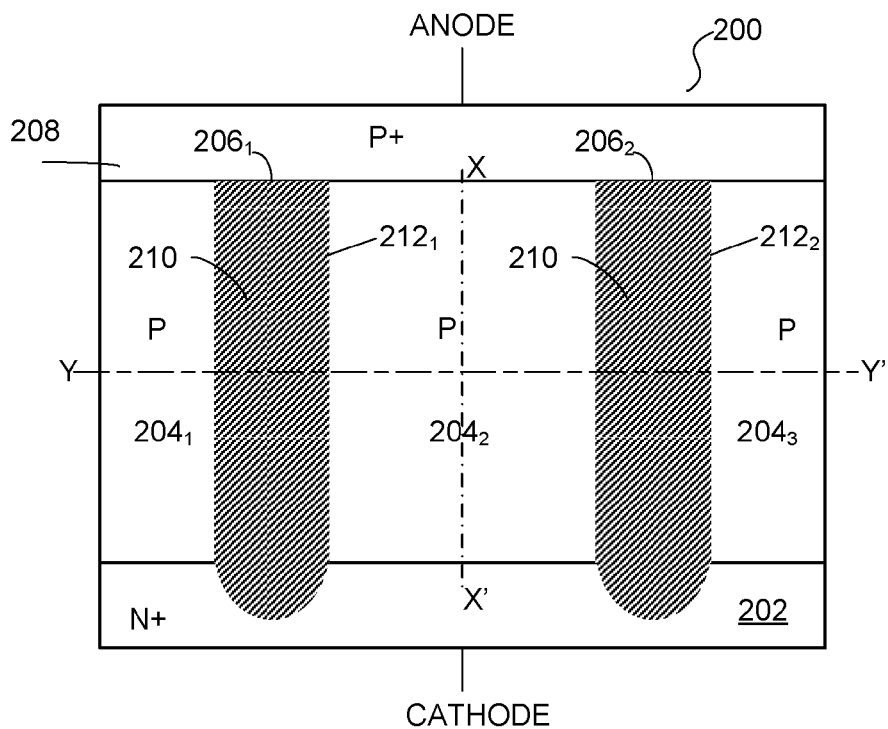
FIG. 2A is a cross-sectional view of an exemplary voltage sustaining semiconductor structure, in accordance with one embodiment of the present invention.

FIG. 2A is a cross-sectional view of a semiconductor structure (referred to herein alternatively as device) 200, in accordance with one embodiment of the present invention. Device 200 is shown as including a cathode terminal coupled to an n+ region 202, an anode terminal coupled to p+ region 208, a p region 204 disposed between p+ region 208 and n+ region 202, and a number of trenches $206_1$, $206_2$ ... $206_N$, collectively and alternatively referred herein below to as trenches 206, formed in a p region 204. For simplicity, the p-region positioned to the left of trench $206_1$ is identified with reference numeral $204_1$, the p-region positioned to the right of trench $206_2$ is identified with reference numeral $204_3$, and the p-region positioned between trenches $206_1$ and $206_2$ is identified with reference numeral $204_2$. Although only two trenches $206_1$, $206_2$ are shown in FIG. 2, it is understood that a high breakdown voltage device in accordance with the present invention may include any number of trenches 206. Furthermore, trenches 206 are shown as extending into n+ region 202.

Figure 2B:
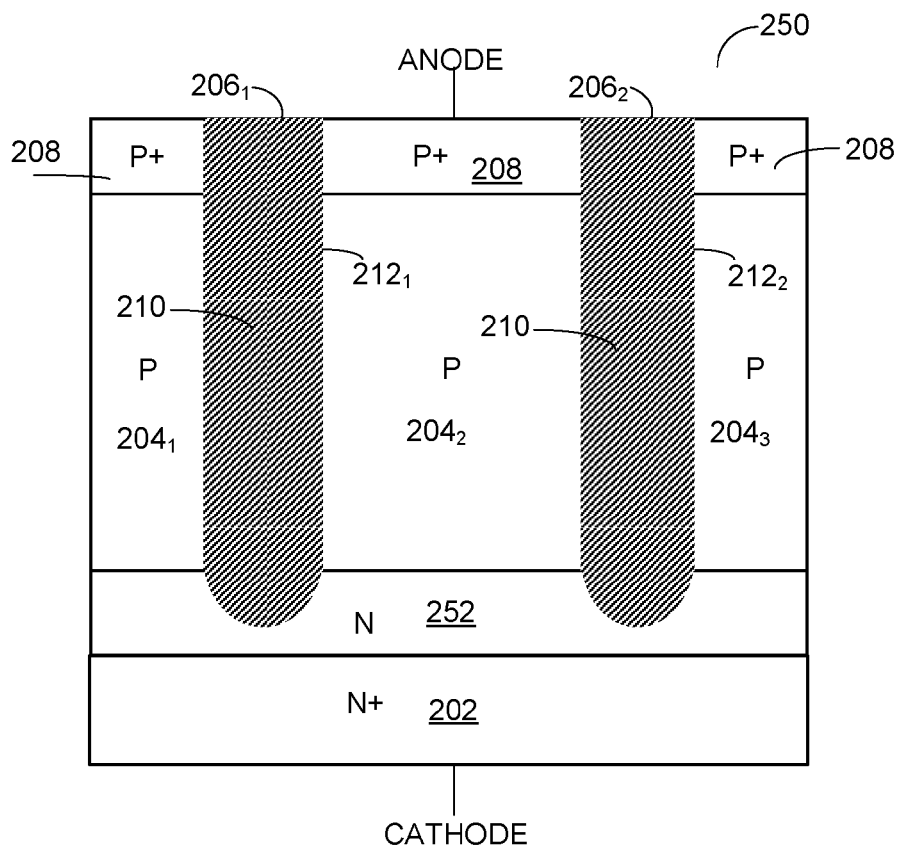
FIG. 2B is a cross-sectional view of an exemplary voltage sustaining semiconductor structure, in accordance with one embodiment of the present invention.

FIG. 2B is a cross-sectional view of a semiconductor 250, in accordance with another embodiment of the present invention. Device 250 is similar to device 200 except that in device 250, an n-type region 252 is disposed between n+ region 202 and p-region 204. In such embodiments, trenches 206 extend into n-type region 252. In the following, different instances of similar elements are alternatively identified by similar reference numerals having different indices—the indices appear as subscripts to the reference numerals. For example, the two shown instances of trenches 206 are alternatively identified as $206_1$, and $206_2$.

In one embodiment, each trench 206 includes one or more dielectric layers 210. In accordance with the present invention, the interface region disposed between each dielectric filled trench 206 and p-region 204 includes positive charges. It is understood that the positive charges may reside inside trenches 206, in a transition region (not shown) between the trench and p-type region 204, in the P-region 204, or a combination thereof. In accordance with the present invention, the positive interface charges present across the opposing surfaces $212_1$ and $212_2$ of trenches $206_1$ $206_2$ are sufficient to cause p region $204_2$ disposed between these two trenches to partially or fully deplete under reverse bias. The partial or full depletion of p-region $204_2$ causes the electric field along line xx' shown in FIG. 2B to remain relatively uniform under externally applied reverse bias between these two terminals.

At reverse bias, the positive charges are balanced by the charges in the depleted semiconductor voltage sustaining region. As described above, the positive charges are, in one embodiment, immobile at typical device operating temperatures. A semiconductor structure, in accordance with the present invention achieves cell pitches that are smaller and with thinner voltage sustaining layer than many conventional SJ structures. Furthermore, by using charges in dielectric layers in contrast to conventional p-n junctions lower capacitances are achieved and less charge stored under reverse recovery conditions. The structures of the present invention are also easier and more cost effective to fabricate.

Referring to FIG. 2A, p-region $204_2$ is depleted due to the positive charges present in the interface regions between trenches 206 and p-region 204$_2$. Assume that line xx' crosses through the center of p-region 204$_2$. Accordingly, the positive charges present near the surface 212$_1$ are balanced by the negative charges present to the left of line xx' in p-region 204$_2$. Similarly, the positive charges present near the surface 212$_2$ are balanced by the negative charges present to the right of line xx' in p-region 204$_2$. Accordingly, the electric field along line xx' is nearly uniform. Consequently, p+ region 208, p-region 204$_2$, and n+ region 206$_2$ collectively define a structure that inhibits or otherwise reduces the termination of electric field lines into p-region 204$_2$ from reverse voltage applied between the cathode and anode terminals of device 200. The positive charge may be realized, for example, by implanting positive ions such as cesium or potassium into an oxide layer that covers the trench walls and bottom. In one example, device 200 is characterized by trenches each having a width of 1 μm and a depth of 10 μm. In such examples, the distance between neighboring trenches may be 2 μm, p-type region 204 may have a doping concentration of $10^{16}$ atoms/cm$^3$, and the charge at the interface of trench-semiconductor has a density (Qf/q) of $10^{12}$ cm$^{-2}$, where q is the electron charge. In such embodiments, a reverse breakdown voltage of 220 volts may be achieved. Without the charge at the interface of trench-semiconductor, the breakdown voltage is only 34 volts.

Figure 2C:
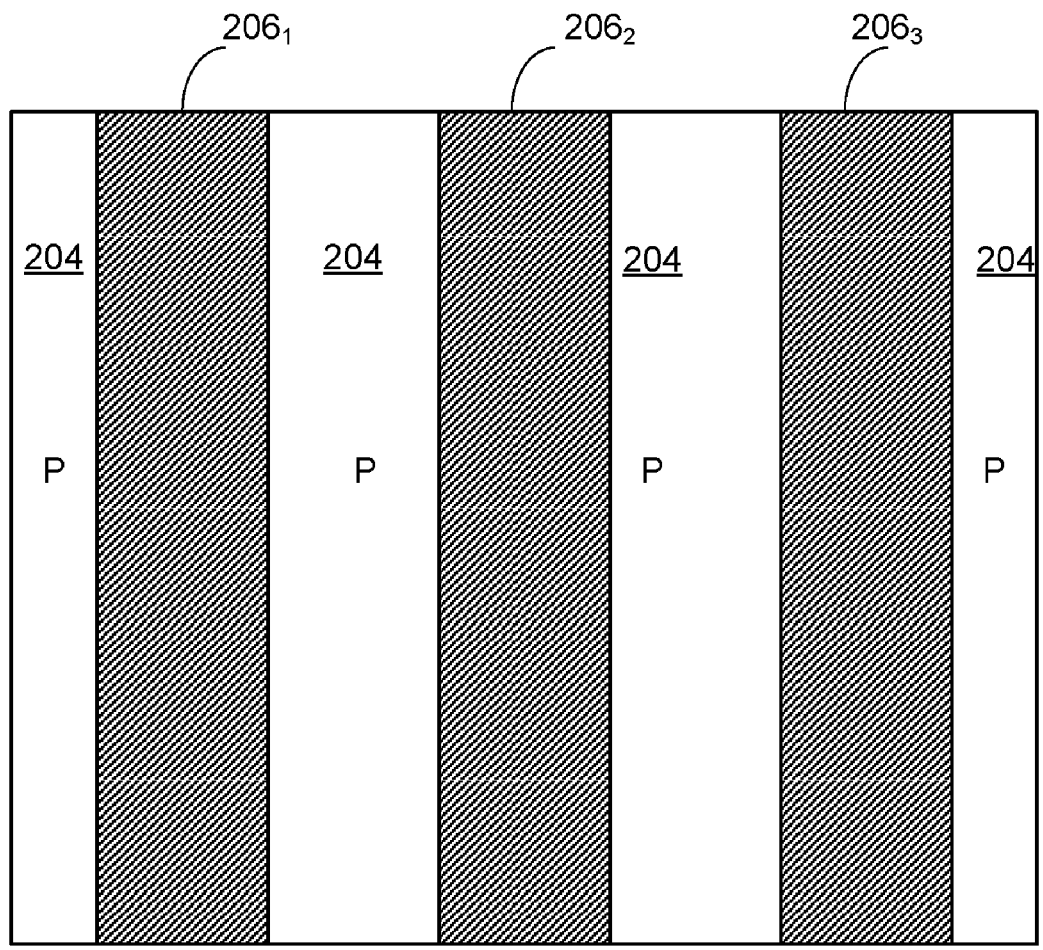
FIGS. 2C, 2D, 2E, 2F are exemplary top views of the device of FIG. 2A, in accordance with one embodiment of the present invention.
Figure 2D:
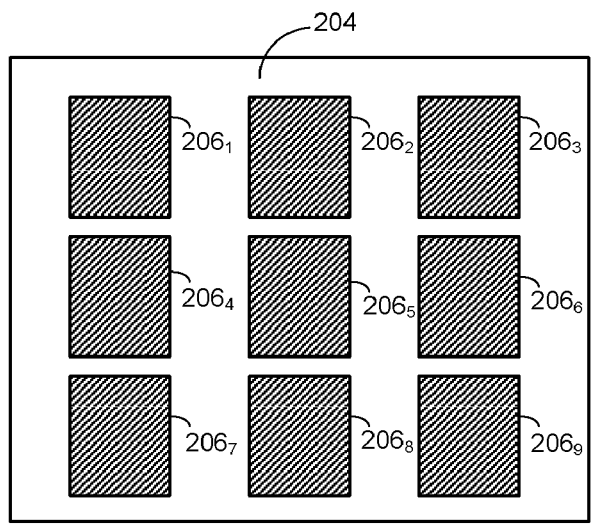

FIG. 2C is an exemplary top view of device 200 viewed along line yy' shown in FIG. 2A. Three of the trenches 206$_1$, 206$_2$ and 206$_3$ are shown as being formed in p-region 204, although it is understood that device 200 may include many more trenches that are not shown in this Figure. FIG. 2D is an exemplary top view of device 200 viewed along line yy' shown in FIG. 2A. In accordance with this example, p-region 204 is shown as including nine trenches 206 that have rectangular top views. FIG. 2E is another exemplary top view of device 200, in accordance with which trenches 206 are shown as having circular top views. It is understood that trenches 206 may have any other top views, such as hexagonal, etc.

Figure 2F:
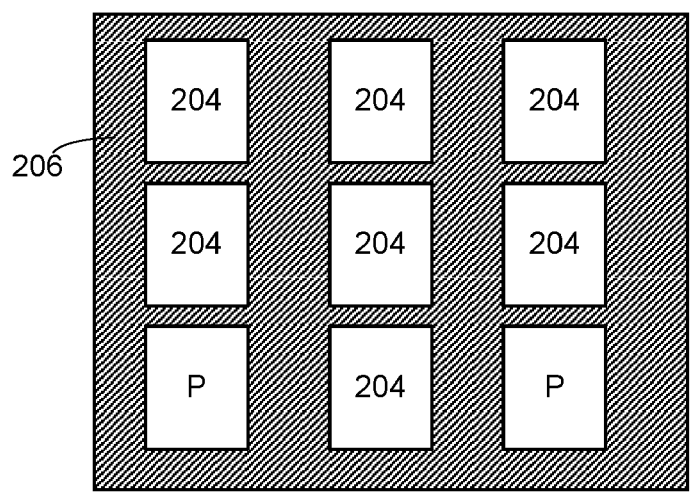
Figure 2E:
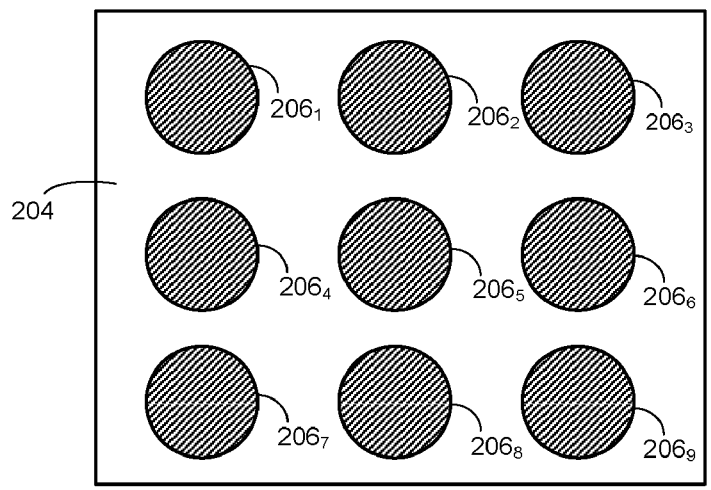

FIG. 2F is another exemplary top view of device 200 viewed along line yy'. In accordance with this example, the trenches divide p-region 204 into a multitude of isolated regions, as seen in FIG. 2F.

Figure 3:
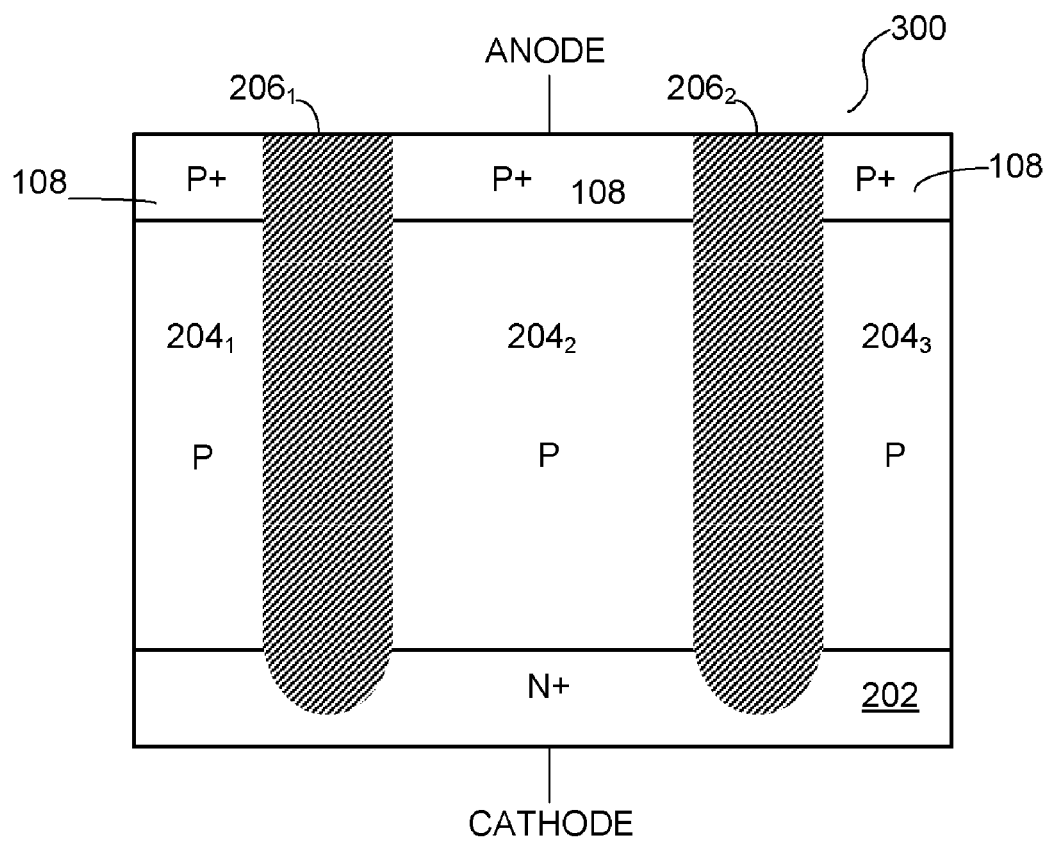
FIG. 3 is a cross-sectional view of an exemplary voltage sustaining semiconductor structure, in accordance with another embodiment of the present invention.

FIG. 3 is a cross-sectional view of an exemplary semiconductor device 300, in accordance with another embodiment of the present invention. Device 300 is similar to device 200 except that in device 300, trenches 206 extend to the top surface of P+ region 208. Device 300 has breakdown characteristics that are otherwise similar to those of device 200.

Figure 4:
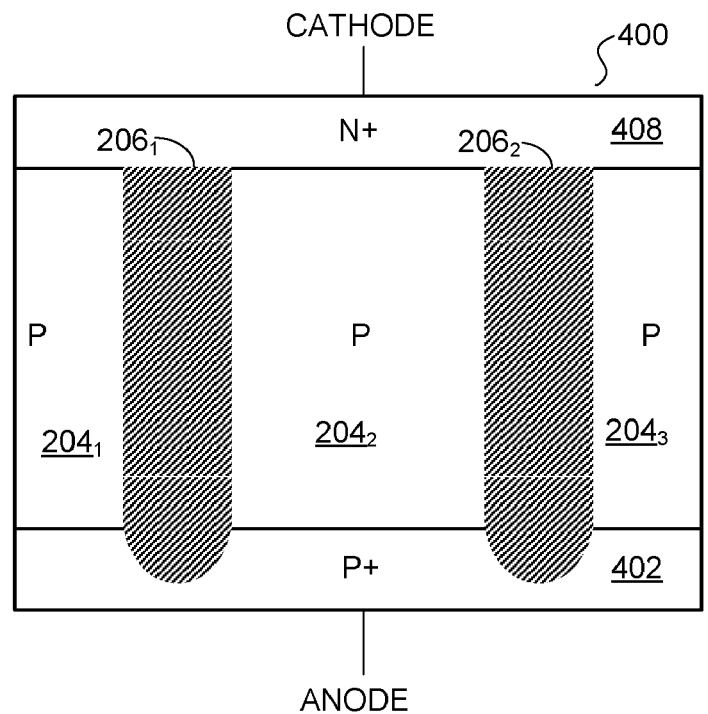
FIG. 4 is a cross-sectional view of an exemplary voltage sustaining semiconductor structure, in accordance with another embodiment of the present invention.

FIG. 4 is a cross-sectional view of an exemplary semiconductor device 400, in accordance with another embodiment of the present invention. Device 400 is similar to device 200 except that in device 400, the cathode terminal is coupled to an n+-type region 408, and the anode terminal is coupled to a p+ type region 402. Device 400 has breakdown characteristics that are otherwise similar to those of device 200.

Figure 5:
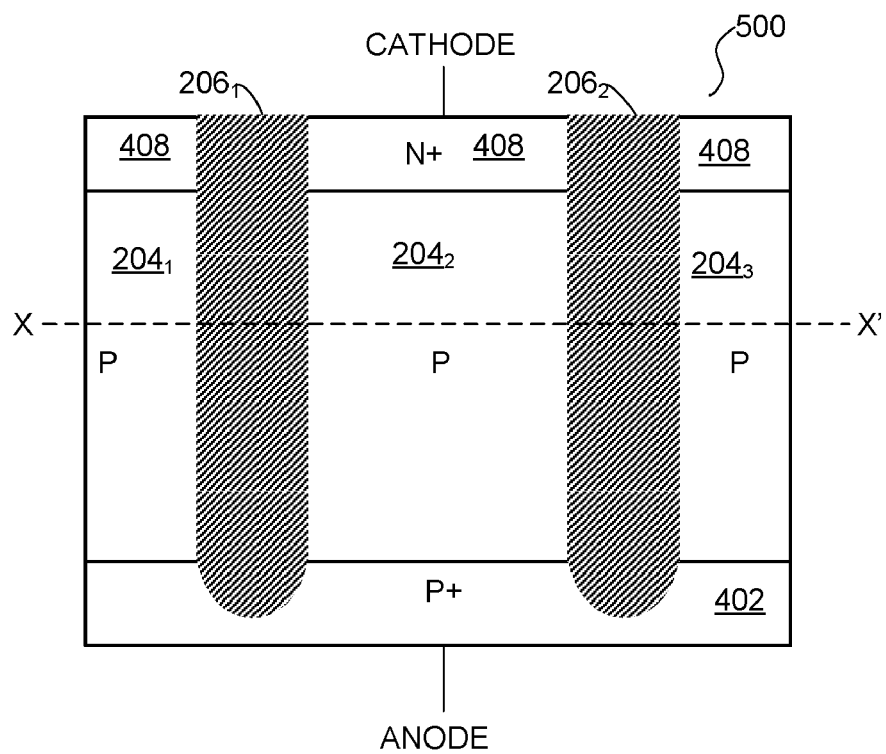
FIG. 5 is a cross-sectional view of an exemplary voltage sustaining semiconductor structure, in accordance with another embodiment of the present invention.

FIG. 5 is a cross-sectional view of an exemplary semiconductor device 500, in accordance with another embodiment of the present invention. Device 500 is similar to device 400 except that in device 500, trenches 206 extend to the top surface of n+ type region 408. Device 500 has breakdown and on-resistance characteristics that are otherwise similar to those of device 400.

Figure 6A:
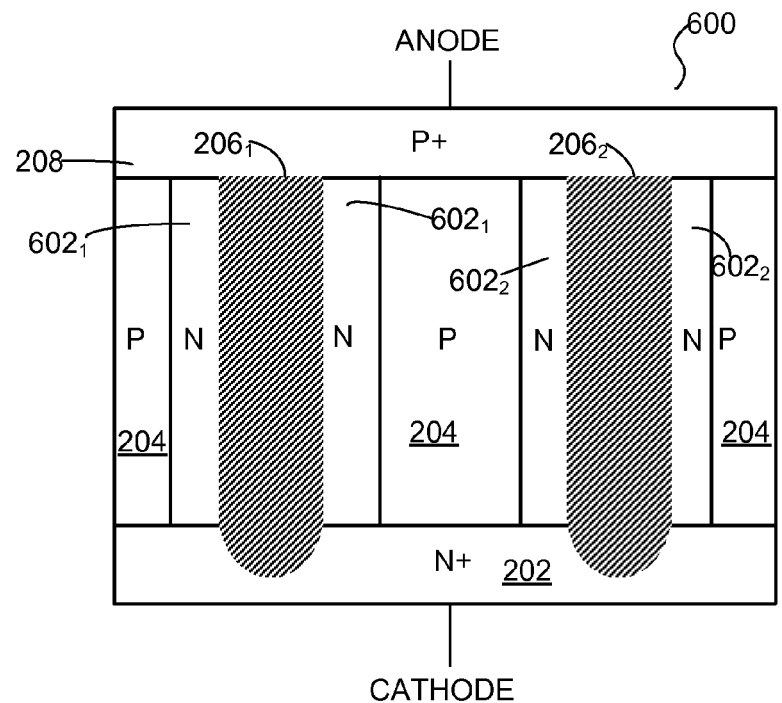
FIG. 6A is a cross-sectional view of an exemplary voltage sustaining semiconductor structure, in accordance with another embodiment of the present invention.
Figure 6B:
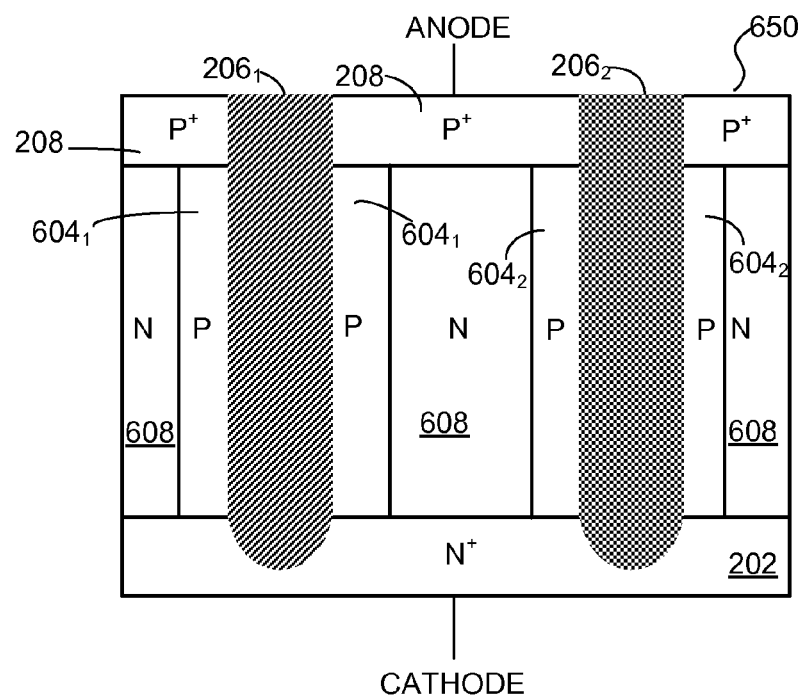
FIG. 6B is a cross-sectional view of an exemplary voltage sustaining semiconductor structure, in accordance with another embodiment of the present invention.

FIG. 6A is a cross sectional view of an exemplary semiconductor device 600, in accordance with another embodiment of the present invention. In device 600, multiple trenches 206 are formed in multiple n-type regions (pillars) 602, which in turn, are formed in P-type region (pillar) 204. For example, as shown, trench 206$_1$ is shown as having been formed in n-type pillar 602$_1$, and trench 206$_2$ is shown as having been formed in n-type pillar 602$_2$. The alternating P and N pillars 204, 602 form a Superjunction structure such that the sum of charges in opposing surfaces of neighboring trenches and their depleted N-regions is equal to the negative charges in the depleted P-region. For example, the sum of positive charges in the opposing surfaces of trenches 206$_1$ and 206$_2$ and the depletion regions of N-regions 602$_1$ and 602$_2$ is substantially equal to the sum of negative charges in the depletion region of the P-region 204 disposed between these two N-regions. In device 600, a significant amount of the positive charges are supplied by the fixed trench-semiconductor interface charges, therefore it is easier to achieve charge balance in device 600 using n pillars compared to conventional SJ devices. The n pillars may be formed using ion-implantation or vapor phase doping. Also, device 600 may provide improved carrier mobility over existing structures As shown in FIG. 6A, the trenches are formed in N-regions 602, which in turn, are formed in P-region 204. FIG. 6B is a cross sectional view of an exemplary semiconductor device 650, in accordance with another embodiment of the present invention In embodiment 650, the trenches are formed in P-type regions 604, which are in turn, formed in N-type region 608.

Figure 7:
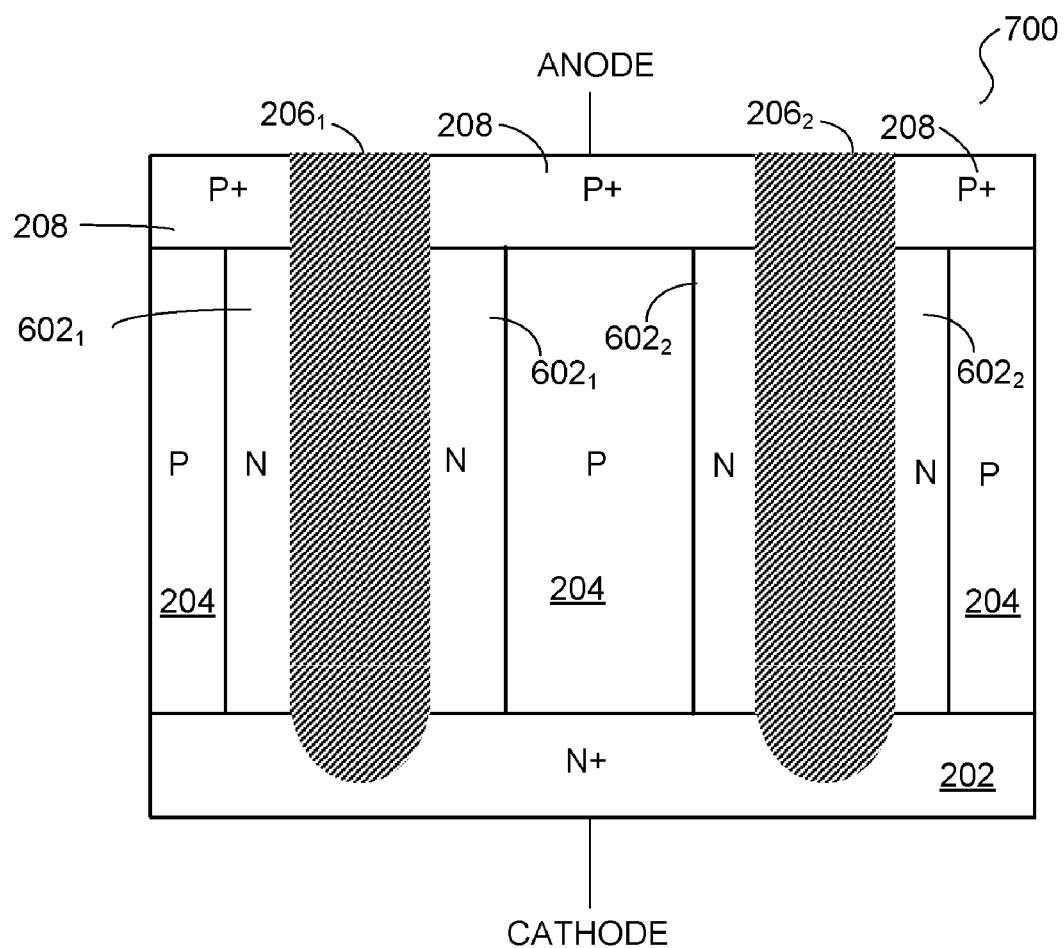
FIG. 7 is a cross-sectional view of an exemplary voltage sustaining semiconductor structure, in accordance with another embodiment of the present invention.

FIG. 7 is a cross sectional view of an exemplary semiconductor device 700, in accordance with another embodiment of the present invention. Device 700 is similar to device 600 except that in device 700, trenches 206 extend to the top surface of p+ region 208. Device 700 has breakdown and on-resistance characteristics that are otherwise similar to those of device 600.

Figure 8:
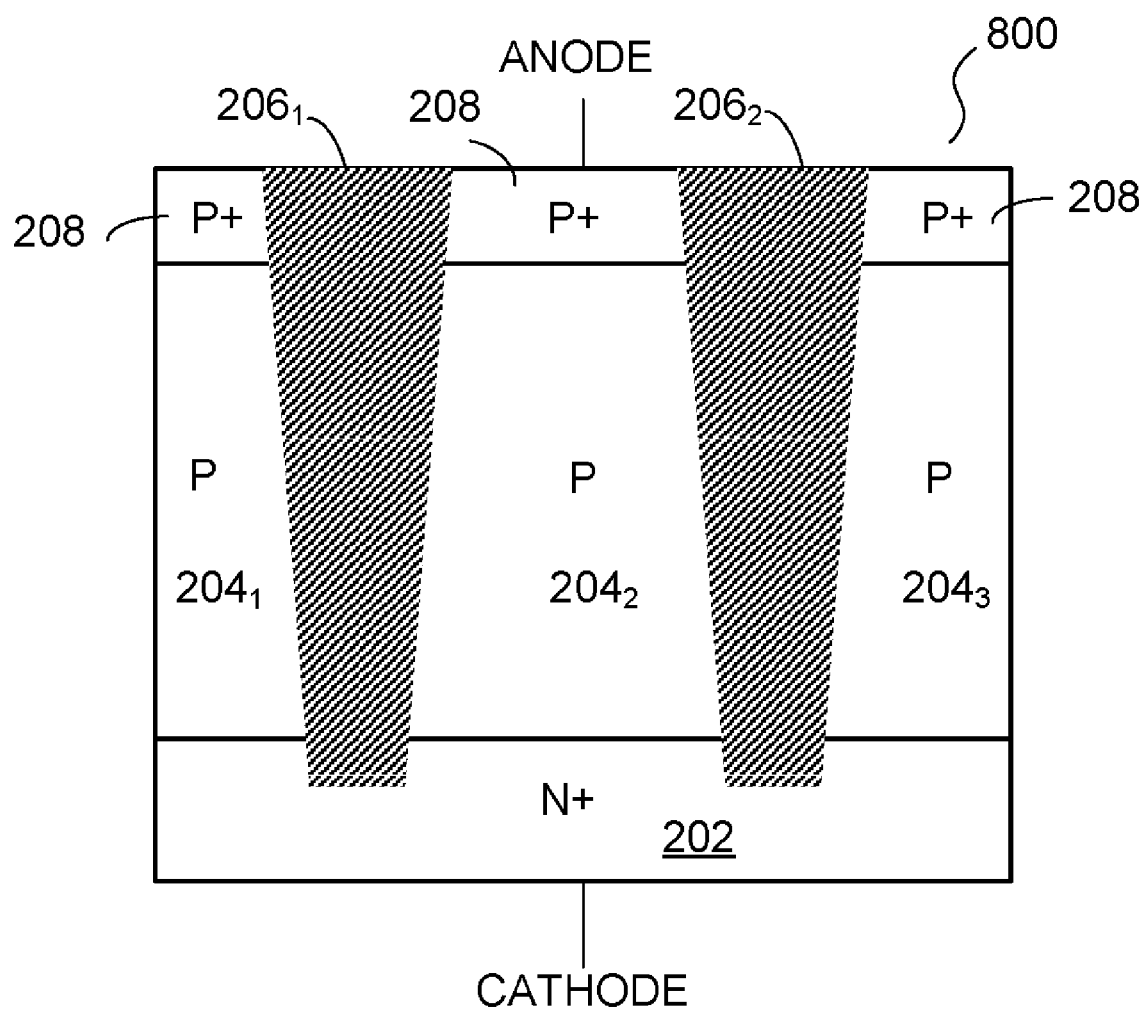
FIG. 8 is a cross-sectional view of an exemplary voltage sustaining semiconductor structure, in accordance with another embodiment of the present invention.

FIG. 8 is a cross sectional view of an exemplary semiconductor device 800, in accordance with another embodiment of the present invention. Device 800 is similar to device 300 except that in device 800 the trenches are tapered so as to be wider near the top of the trench than they are at the bottom of the trench. The trenches are tapered either by design or as a result of the processing steps or equipments, such as etching, that may be used to form the trenches. Accordingly, in device 800, the electric field is higher near the bottom of the trenches 206 than it is near the top of the trenches 206 unless the doping profile of the impurities in the semiconductor is adjusted to eliminate this effect.

Figure 9:
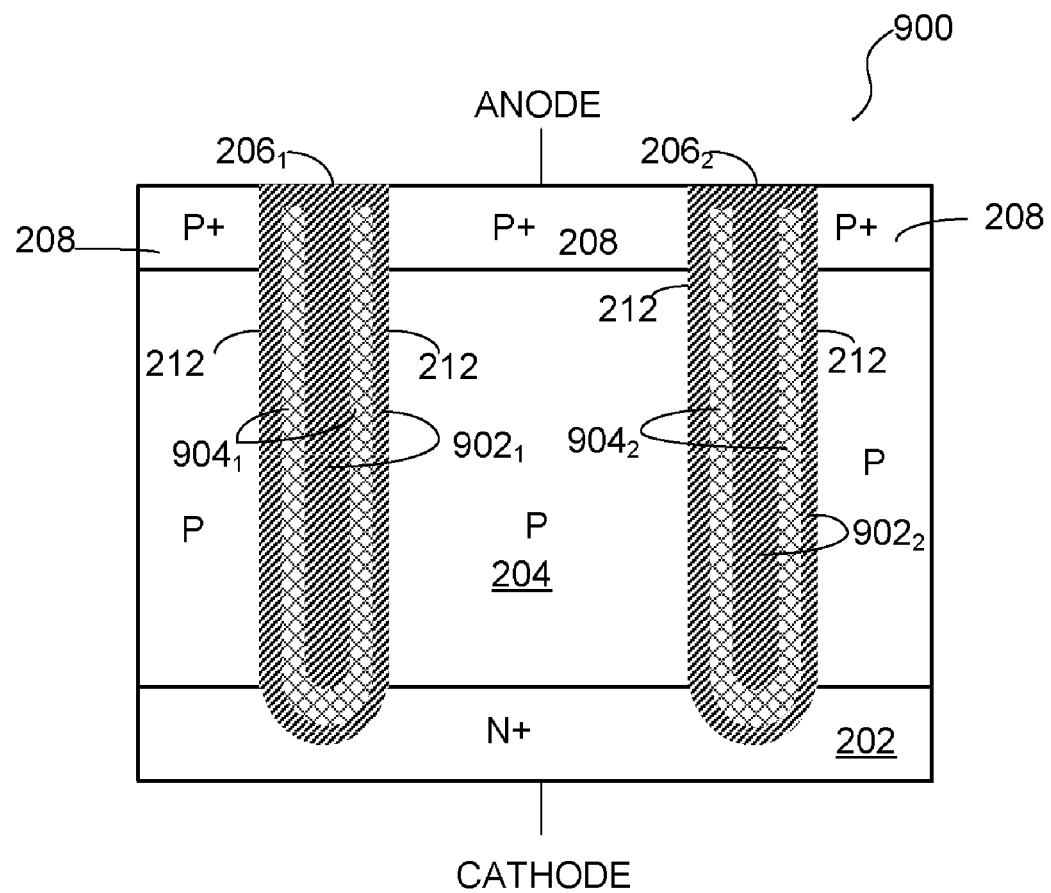
FIG. 9 is a cross-sectional view of an exemplary voltage sustaining semiconductor structure, in accordance with another embodiment of the present invention.

FIG. 9 is a cross sectional view of an exemplary semiconductor device 900, in accordance with another embodiment of the present invention. In Device 900, each trench 206 is shown as including two different layers, namely a first layer 902, and a second layer 904. Second layer 904 is used either to generate a fixed charge or as a cap layer to ensure that the charges used to deplete p-region 204 are maintained near the surfaces 212 during device fabrication.

Figure 10:
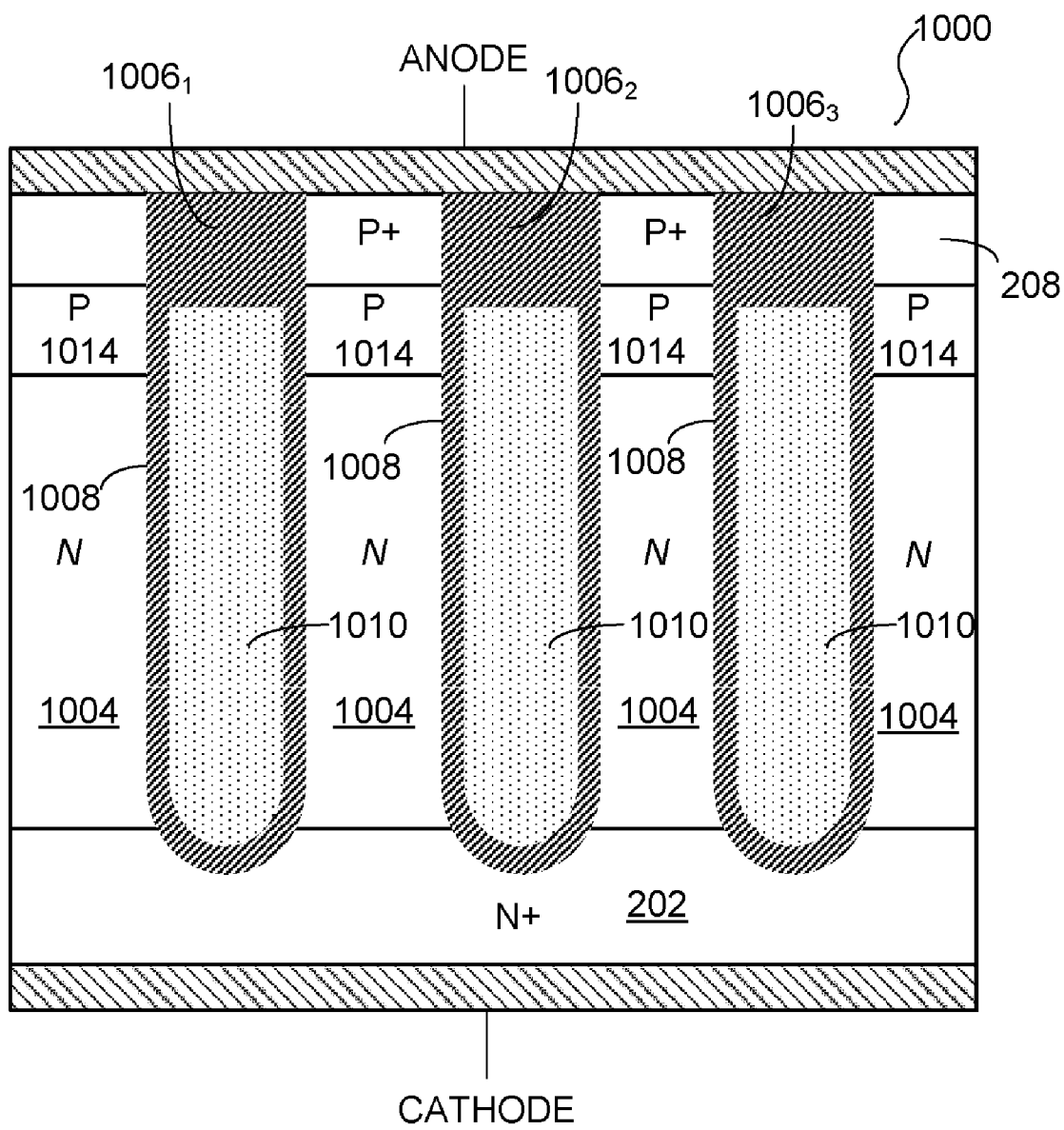
FIG. 10 is a cross-sectional view of an exemplary voltage sustaining structure component, in accordance with another embodiment of the present invention.

In accordance with some embodiments of the present invention, the trenches include materials that include negative charges adapted to deplete the N regions in which the trenches are partly formed. FIG. 10 is a cross-sectional view of a semiconductor device 1000, in accordance with one embodiment of the present invention. Device 1000 is shown as including a cathode terminal coupled to an n+ region 202, an anode terminal coupled to p + region 208 overlaying p region 1014, and a number of trenches 1006$_1$, 1006$_2$ . . . 1006$_N$, collectively and alternatively referred herein below to as trenches 1006, formed in N region 1004 overlaying N+ region 202. Although only three trenches 1006$_1$, 1006$_2$ and 1006$_2$ are shown in FIG. 10, it is understood that a high breakdown voltage device in accordance with the present invention may include any number of trenches 1006. Furthermore, although trenches 1006 are shown as extending into n+ region 202, it is understood that in other embodiments, trenches 1006 may not extend into n+ region 202.

In the exemplary embodiment shown in FIG. 10, each trench 1006 is shown as including a first dielectric layer 1008, a second layer 1010. In one embodiment, the second layer 1010 includes a number of materials that may or may not include dielectric materials. As is shown in FIG. 10, the interface region disposed between each trench 1006 and the adjacent N region 1004 includes negative charges. Further in accordance with the present invention, the negative interface charges present across the opposing surfaces of the neighboring trenches is sufficient to cause the N region 1004 disposed between such neighboring trenches to fully or partially deplete under reverse bias. For example, the negative charges present in neighboring trenches $1006_1$ and $106_2$ is sufficient to cause the N region 1004 disposed between these two trenches to deplete at reverse bias. The depletion of N region $1004_2$ provides an effective semiconductor-insulator-semiconductor structure between the anode and cathode terminals, thereby limiting the electric field lines that would otherwise terminate into the depleted N regions 1004 from an externally applied reverse voltage between these two terminals.

In one embodiment, n-type region 1004 is an epitaxial layer grown over a heavily doped n+substrate 202. In one embodiment, the n-type epitaxial layer 1004 is uniformly doped. In another embodiment, the n-type epitaxial layer 1004 is non-uniformly doped. For example, the doping profile can be graded to have higher doping at the substrate relative to the surface or vice versa.

In the embodiment illustrated in FIG. 10, a first dielectric material 1008, for example, a thermally grown oxide layer, is formed along the bottom and the walls of the trenches. In one embodiment, the first dielectric material ranges in thickness from about 2 nm to about 200 nm. For example, the thickness of the first dielectric material may be about 30 nm. Trenches 1006 are shown as including a second material 1010, which may include one or more materials/compound layers, in the interior regions of the trenches and enclosed within the first dielectric material 1008. Second material 1010, which may be aluminum fluoride, provides negative charges at the interface between the $AlF_x$ layer and the first dielectric material 1008.

Figure 11:
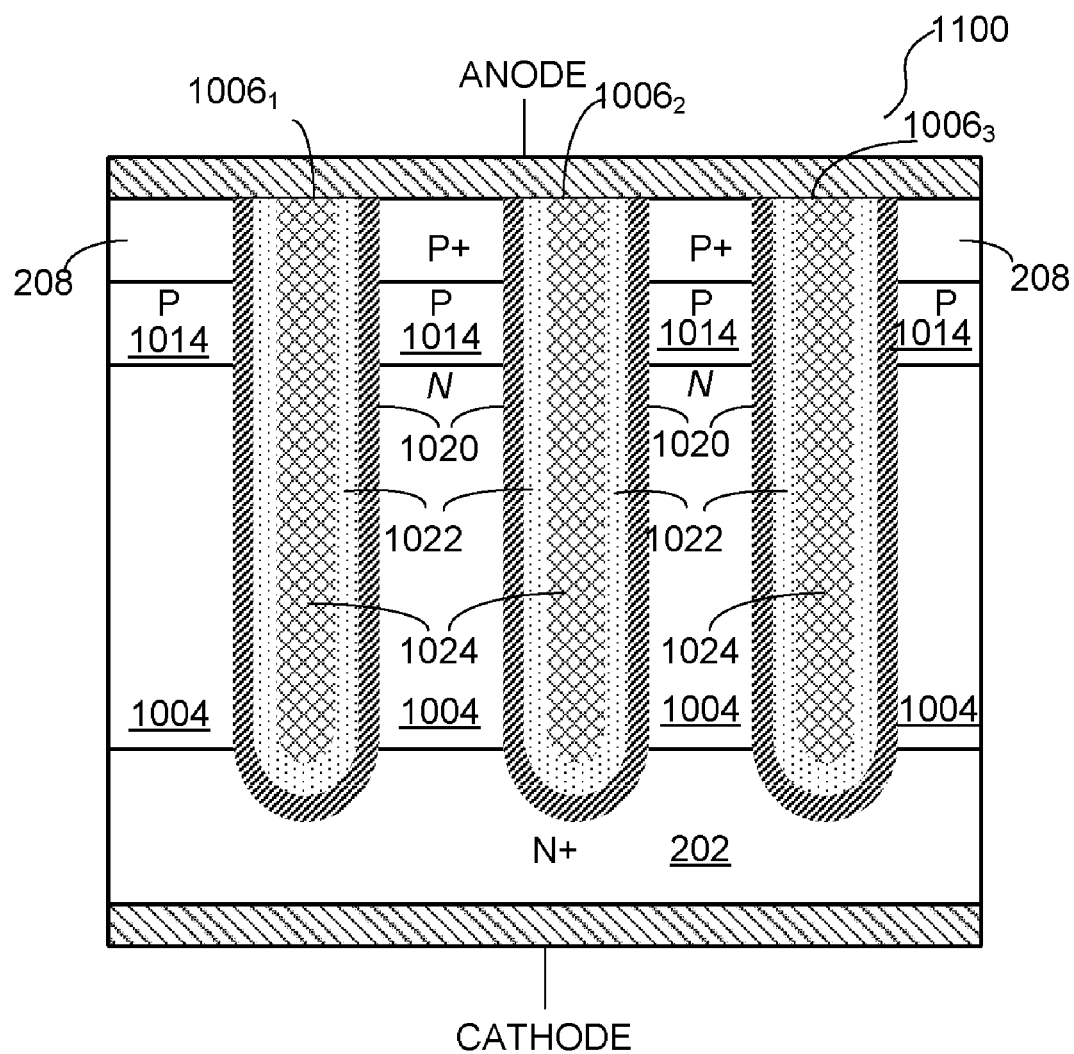
FIG. 11 is a cross-sectional view of an exemplary voltage sustaining semiconductor structure, in accordance with another embodiment of the present invention.

FIG. 11 is a cross-sectional view of a semiconductor device 1100, in accordance with another embodiment of the present invention. Device 1100 is similar to device 1000 except that in device 1100, each trench 1006 is shown as including a first dielectric layer 1020, a second layer 1022, and a third layer 1024. In one embodiment, each third layer 1024 includes a number of materials that may or may not include dielectric materials. Embodiment 1100 is otherwise similar to embodiment 1000.

In device 1100, each trench 1006 includes a first layer 1020 that is a dielectric layer, a second layer 1022, and a third layer 1024 that is a dielectric layer. First layer 1020 is formed on the walls and bottom of the trenches. Second layer 1022—which may include more than one material—is formed so as to be enclosed within the first layer 1020. Third layer 1024 is formed so as to be enclosed within second layer 1022. In one embodiment, third layer 1024 is formed from the same material as the first layer 1020. In another embodiment, the first and second dielectric layers are formed using different materials. Disposing layer 1022 which may include, for example, aluminum fluoride, between the two dielectric layers 1020 and 1024 provides negative charges at the interfaces between the dielectric layers 1020, 1024 and layer 1022. The various n+, p+, n and p-type layers of device 1100 are formed using conventional fabrication processes such as implantation, diffusion, annealing, and the like.

Figure 12A:
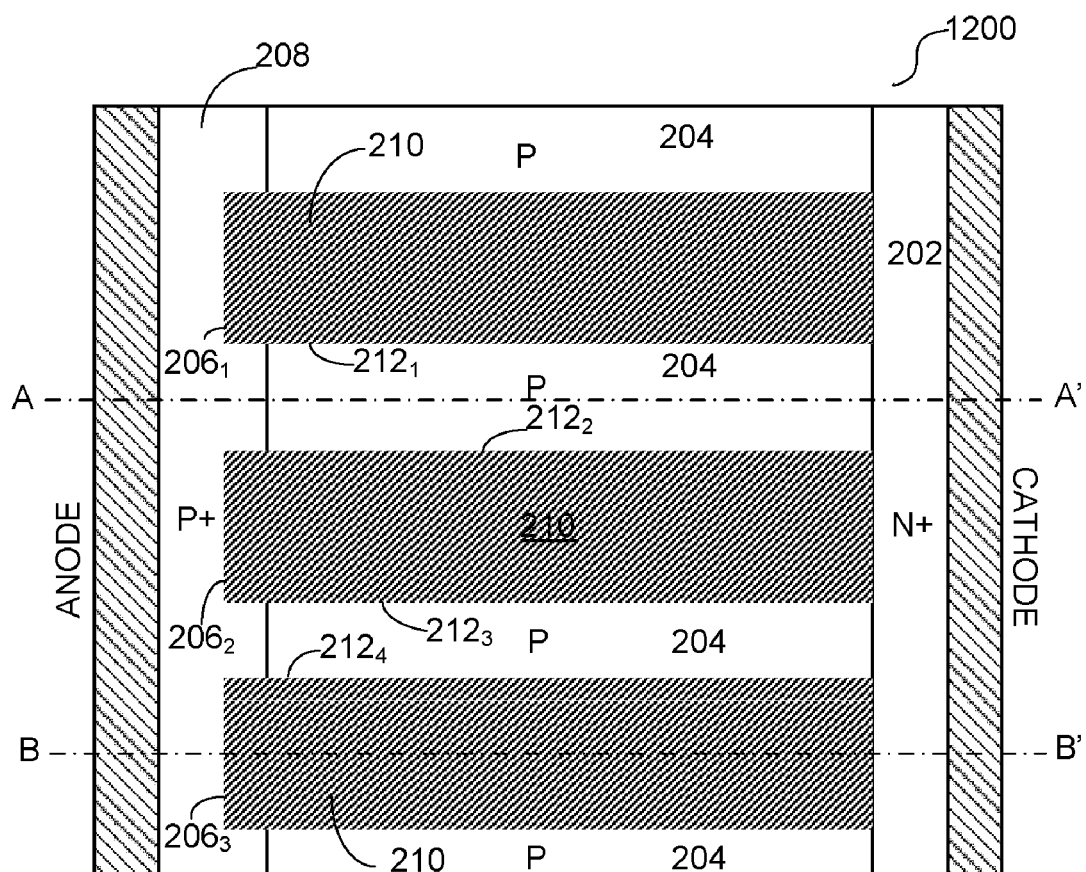
FIG. 12A is a top view of a lateral voltage sustaining semiconductor structure, in accordance with another embodiment of the present invention.

FIG. 12A is a simplified top view of a lateral high voltage semiconductor device 1200, in accordance with another embodiment of the present invention. Device 1200 is shown as including a cathode terminal coupled to an n+ region 202, an anode terminal coupled to p+ region 208, a p-type region 204 disposed between p+ region 208 and n+ region 202, and a number of trenches $206_1, 206_2 \ldots 206_N$, collectively and alternatively referred herein below to as trenches 206, formed in a p region 204. Although only three trenches $206_1, 206_2$ and $206_3$ are shown in FIG. 12A, it is understood that a high breakdown voltage device in accordance with the present invention may include any number of trenches 206.

In one embodiment, each trench 206 includes one or more dielectric layers 210. In accordance with the present invention, positive charges are intentionally introduced into trenches 206. Such charges may reside in the trenches, in a transition region between the trench and p-type region 204, in the P-region 204, or a combination thereof, and are collectively and alternatively referred to herein as interface charges. Such positive interface charges present across the opposing surfaces of the trenches is sufficient to cause the p region 204 disposed between such two trenches to partially or fully deplete at a reverse bias. For example, the charges present near opposing surfaces $212_1$ and $212_2$ of trenches $206_1, 206_2$ are sufficient to cause p-type region $204_2$ disposed between these two trenches to partially or fully deplete at a reverse bias. Similarly, the charges present near opposing surfaces $212_3$ and $212_4$ of trenches $206_2, 206_3$ are sufficient to cause p-type region 204 disposed between these two trenches to partially or fully deplete at a reverse bias. The partial or full depletion of p-type regions 204 at a reverse bias causes the electric field along, for example, a plane perpendicular to line AA' positioned at the midpoint of opposing surfaces $212_1$ and $212_2$ to remain relatively uniform under an externally applied reverse bias between the cathode and anode terminals. At a reverse bias, the positive interface charges are balanced by the charges in the depleted charge of the P-type regions 204. As described above, the positive charges are, in one embodiment, immobile at typical device operating temperatures.

Figure 12B:
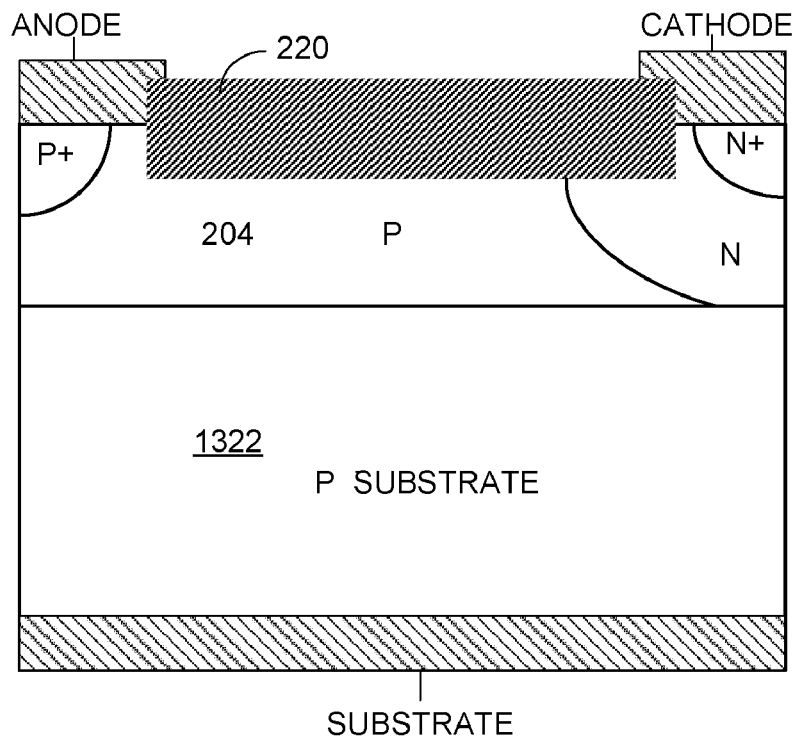
FIGS. 12B and 12C are various cross-sectional view of the device shown in FIG. 12A.
Figure 12C:
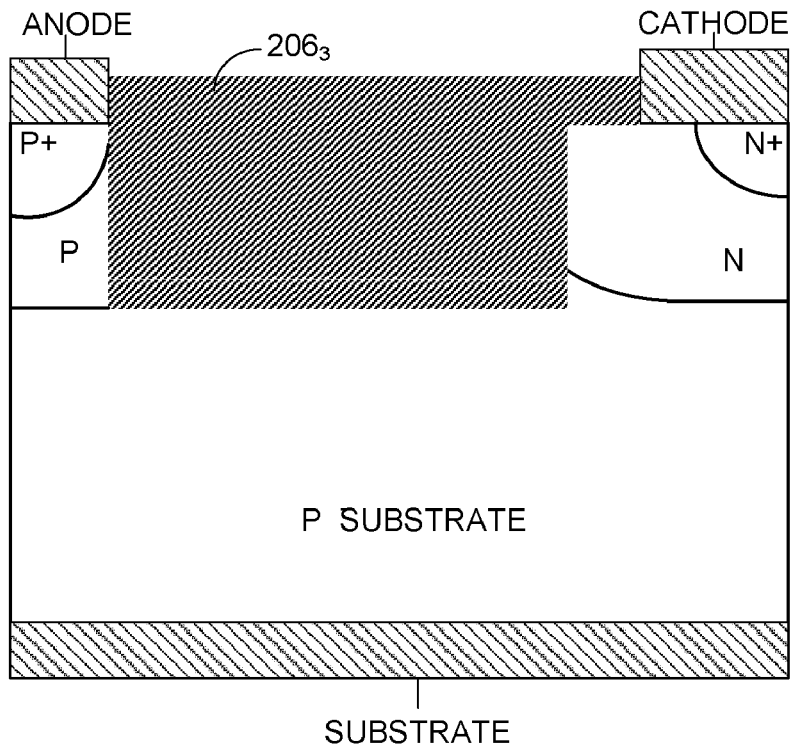

FIG. 12B is a simplified cross-sectional view of structure 1200 along lines AA'. Referring to FIG. 12B, p-type region 204 is fully or partially depleted under a reverse bias. Dielectric layer 220 covers the entire structure and is used to passivate the semiconductor device. FIG. 12C is a simplified cross-sectional view of structure 1200 along lines BB' showing trench $206_3$ and various other regions of device 1200.

Figure 13A:
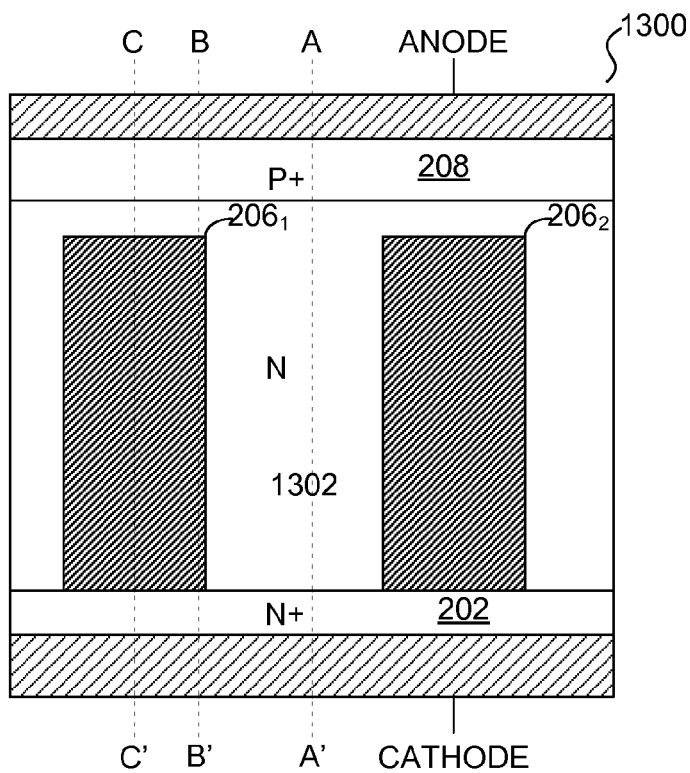
FIG. 13A is a top view of a lateral voltage sustaining semiconductor structure, in accordance with another embodiment of the present invention.
Figure 13B:
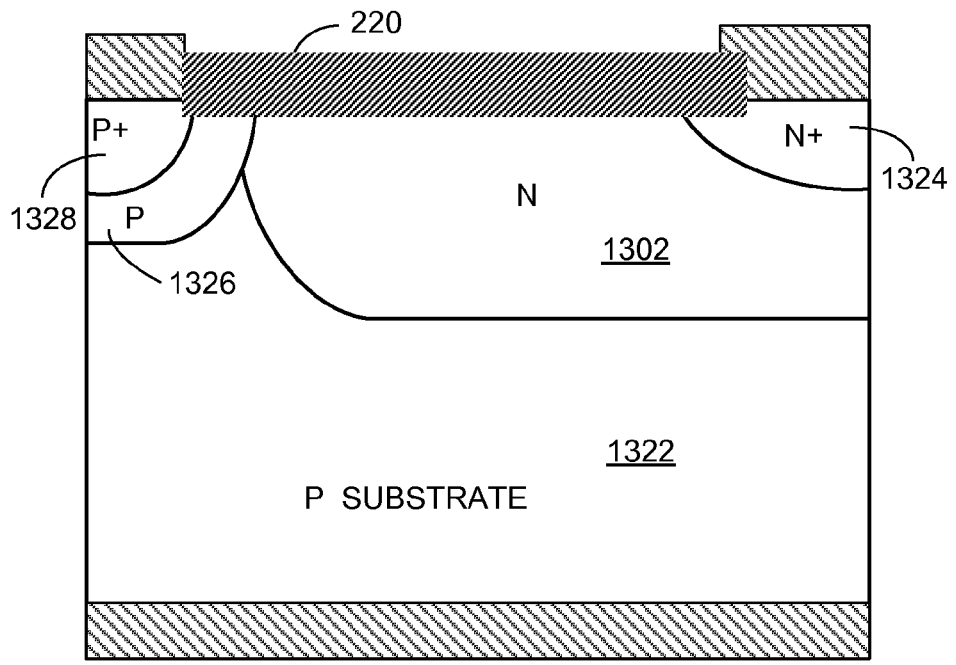
FIGS. 13B, 13C and 13D are various cross-sectional view of the device shown in FIG. 13A.

FIG. 13A is a simplified top view of a lateral high voltage semiconductor device 1300, in accordance with another embodiment of the present invention. Device 1300 is shown as including a cathode terminal coupled to an n+ region 202, an anode terminal coupled to a p+ region 208, an n-type region 1302 disposed between n+ region 202 and p+ region 208, and a number of trenches $206_1, 206_2 \ldots 206_N$, collectively and alternatively referred hereinbelow to as trenches 206, formed in n-type region 1302. Although only two trenches $206_1, 206_2$ are shown in FIG. 13A, it is understood that a high breakdown voltage device in accordance with the present invention may include any number of trenches 206. FIG. 13B is a cross-sectional view of structure 1300 along lines AA'. Referring to FIG. 13B, n-type region 1302 is fully or partially depleted under a reverse bias. Dielectric layer 220 covers the entire structure and is used to passivate the semiconductor device.

Figure 13C:
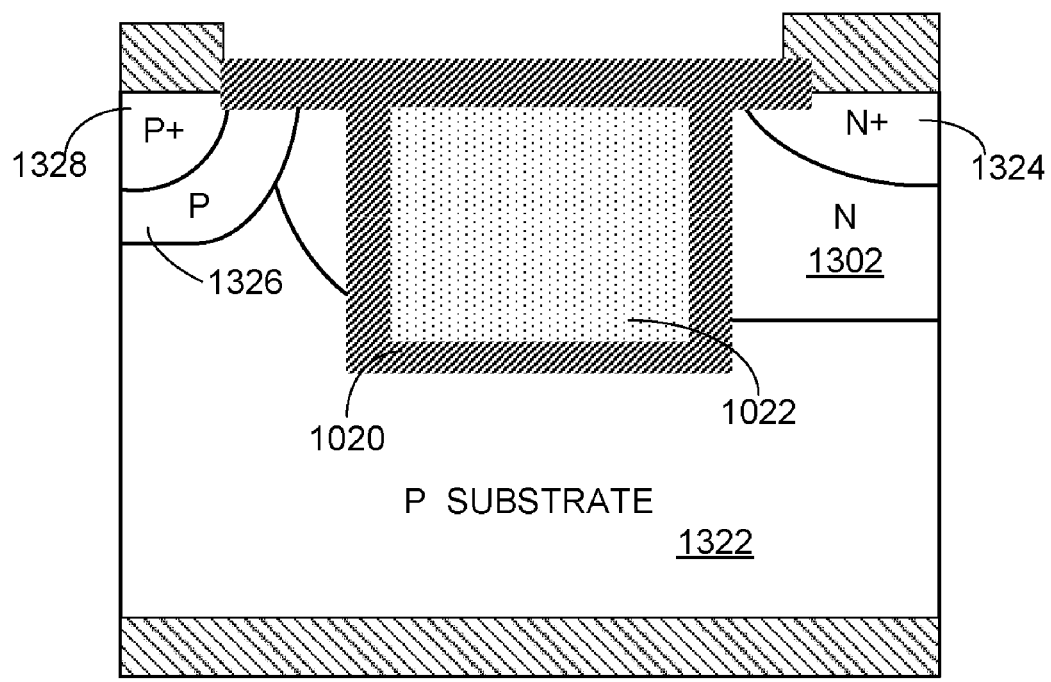
Figure 13D:
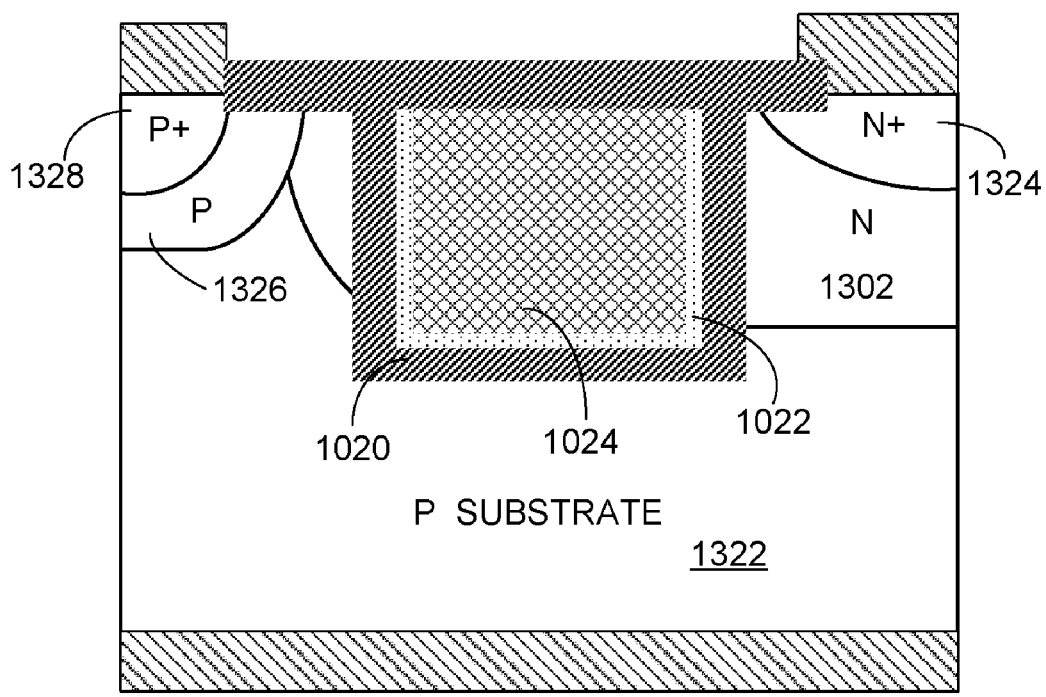

FIGS. 13C and 13D are cross-sectional views of semiconductor device 1300 along lines BB' and CC'. Device 1300 is similar to device 1200 except that in device 1300, each trench 1006 is shown as including a first dielectric layer 1020, a second layer 1022, and a third layer 1024 (FIG. 13D). Furthermore, unlike device 1200, in device 1300 the trenches are formed so as to include negative charges to deplete N-region 1302. In one embodiment, each third layer 1024 includes a number of materials that may or may not include dielectric materials.

In device 1300 and as described above, each trench 1006 includes a first layer 1020 that is a dielectric layer, a second layer 1022, and a third layer 1024 that is a dielectric layer. First layer 1020 is formed on the walls and bottom of the trenches. Second layer 1022—which may include more than one material—is formed so as to be enclosed within the first layer 1020. Third layer 1024 is formed so as to be enclosed within second layer 1022. In one embodiment, third layer 1024 is formed from the same material as the first layer 1020. In another embodiment, the first and second dielectric layers are formed using different materials. Disposing layer 1022 which may include, for example, aluminum fluoride, between the two dielectric layers 1020 and 1024 provides negative charges at the interfaces between the dielectric layers 1020, 1024 and layer 1022. The various layers of device 1300 are formed using conventional fabrication processes such as implantation, diffusion, annealing, and the like.

Figure 14:
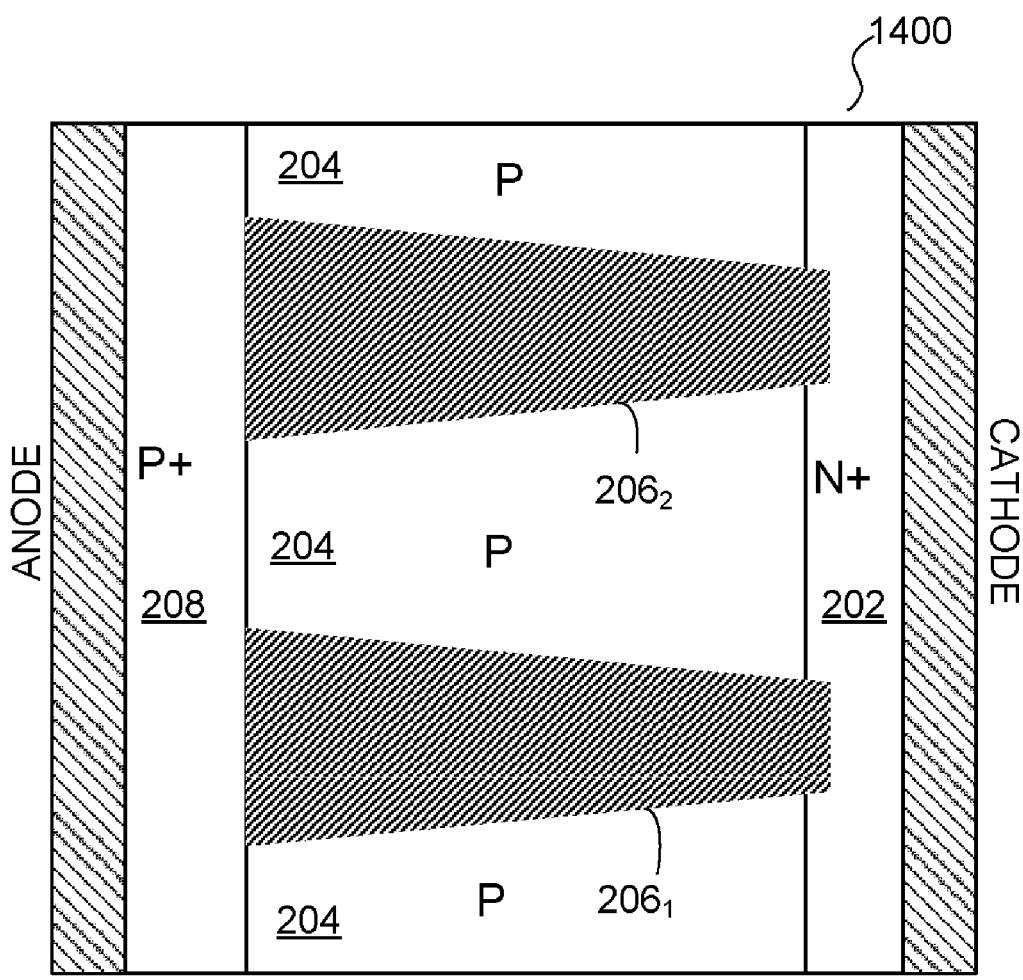
FIG. 14 is a top view of a lateral voltage sustaining semiconductor structure, in accordance with another embodiment of the present invention.

FIG. 14 is a simplified top view of a lateral high voltage semiconductor device 1400, in accordance with another embodiment of the present invention. Device 1400 is similar to device 1200 except that in device 1400 the trenches are tapered so as to be have wider widths near the anode terminal than near the cathode terminal to compensate for the depletion charge generated in the p-substrate.

Figure 15A:
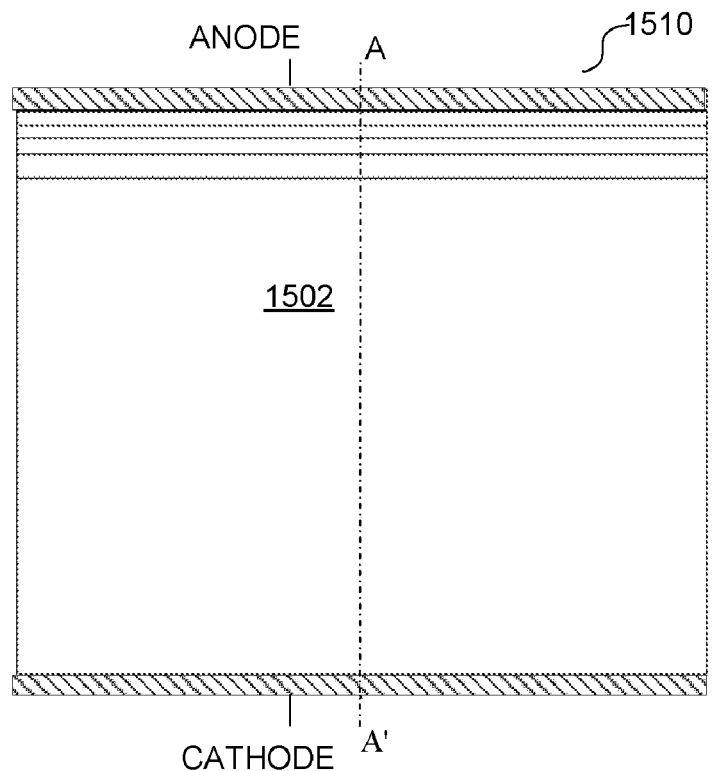
FIGS. 15A and 15B are computer simulations showing equipotential lines at breakdown voltages respectively for a conventional structure, and a structure in accordance with one exemplary embodiment of the present invention.
Figure 15B:
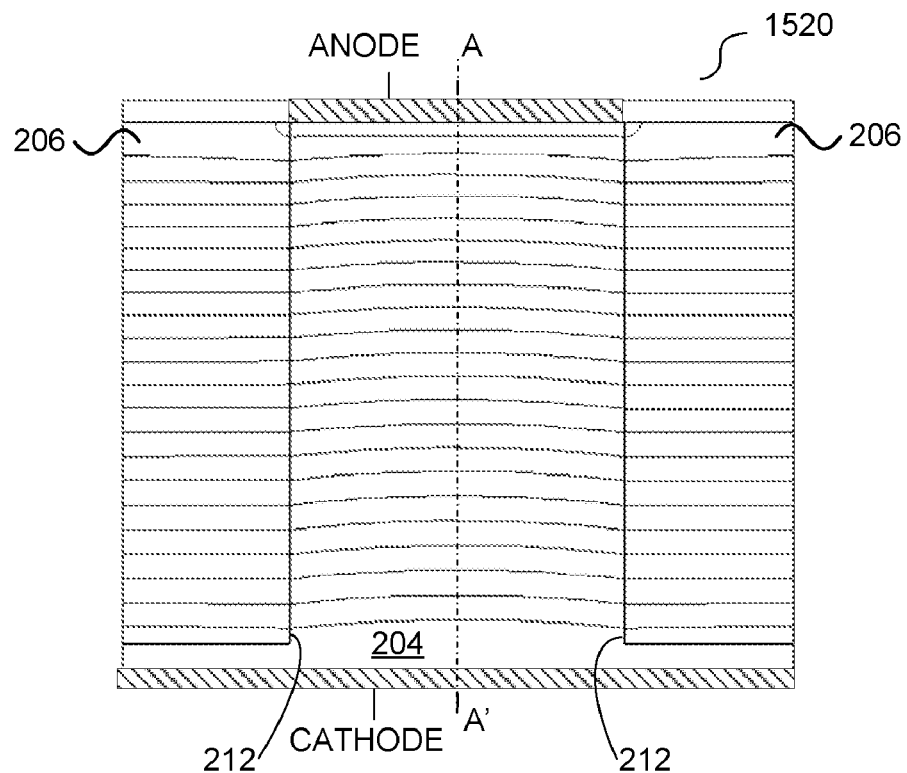

FIGS. 15A and 15B show the equipotential lines at breakdown voltages respectively for a conventional structure 1510, and a structure 1520 in accordance with one exemplary embodiment of the present invention. Each iso-contour represents 10 volts in this simulation. Structure 1510 includes a semiconductor region 1502 disposed between the diode's associated anode and cathode terminals. Structure 1520 is shown as including trenches 206. Positive interface charges having a charge density ($Q_i/q$) of $1 \times 10^{12}$ cm$^{-2}$ (q is the electron charge) are present at the interface of the trenches 206 and P-region 204, in accordance with the present invention. A trenches 206 width of 1 um, and an anode to cathode distance of 10 um was used for this simulation. The doping level of the semiconductor regions 1502 and 204 was $2 \times 10^{16}$ cm$^3$. In accordance with this simulation, the breakdown voltage of conventional structure 1510 is approximately 34 volts, whereas the breakdown voltage of structure 1520 of the present invention is 220 volts.

Figure 15C:
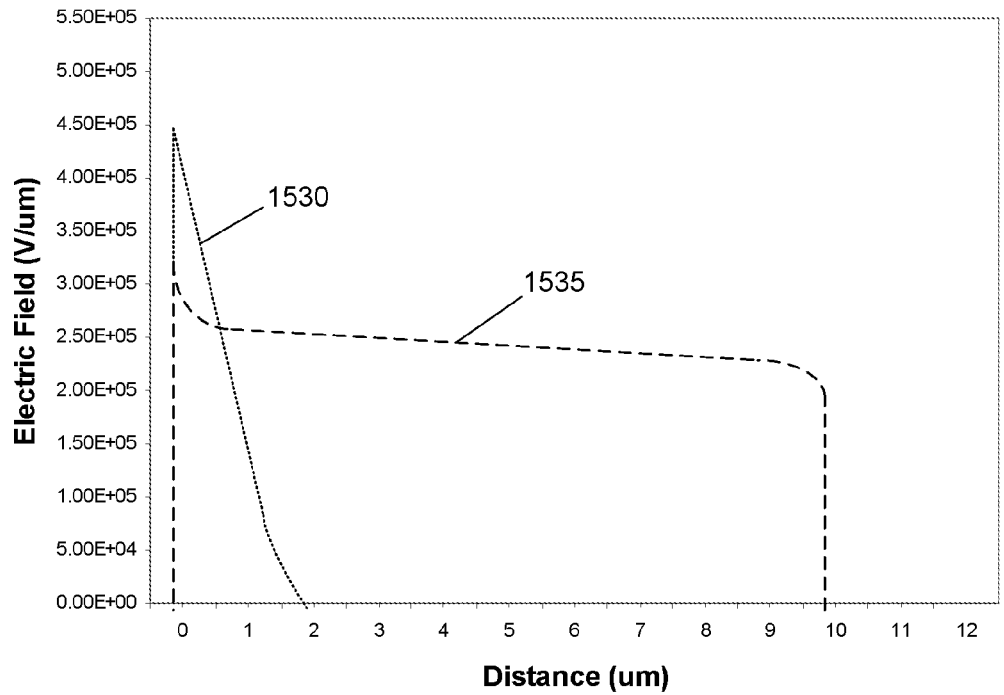
FIG. 15C shows the electric field along cross-sectional line AA' for the structures shown in FIGS. 15A-B.

FIG. 15C shows the electric field along cross-sectional line AA' for the structures shown in FIGS. 15A-B. The electric field distribution for structure 1510 is shown using plot 1530. The significantly improved electric field distribution for structure 1520 is shown using plot 1535. The partial or full depletion of p-type regions 204 at a reverse bias causes the electric field along cross-sectional line AA' positioned at the midpoint of opposing surfaces 212 and 212 to remain relatively uniform under an externally applied reverse bias between the cathode and anode terminals. For structure 1510, under reverse bias, the electric field from ionized dopants in region 1502 terminate at the anode, thereby causing the electric field to have a triangular profile.

Figure 15D:
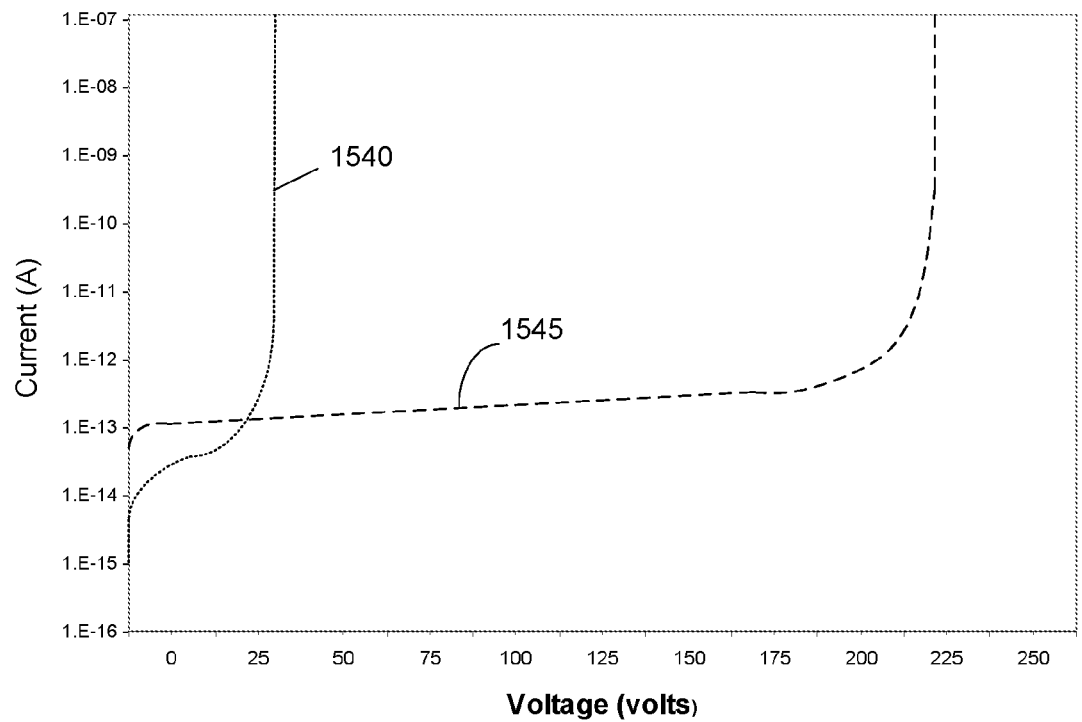
FIG. 15D shows the reverse bias current-vs-voltage characteristics for the structures shown in FIGS. 15A-B.

FIG. 15D shows the reverse bias current-v-voltage characteristics for structures 1510 (plot 1540) and 1520 (plot 1545).

As is shown, the breakdown voltage of structure 1510 is 34 volts, and the breakdown voltage of structure 1520 is 220 volts.

The above embodiments of the present invention are illustrative and not limiting. Various alternatives and equivalents are possible. The invention is not limited by the type of device or integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A semiconductor structure comprising:
    a first semiconductor region coupled to a first terminal of the structure;
    a second semiconductor region coupled to a second terminal of the structure;
    a third semiconductor region disposed between the first and second semiconductor regions; and
    at least first and second dielectric regions extending a first distance along a depth of the third semiconductor region, wherein said first and second semiconductor regions are of opposite conductivity types, and wherein the at least first and second dielectric regions or an interface region between each of said at least first and second dielectric regions and said third semiconductor regions includes intentionally introduced charges.

2. The semiconductor structure of claim 1, wherein said at least first and second dielectric regions extend into the first and second semiconductor regions.

3. The semiconductor structure of claim 1, wherein an integrated density of doping impurities in the third semiconductor region along a line parallel to a surface of the at least first and second dielectric regions ranges from about $1 \times 10^{12}/$cm$^2$ to about $5 \times 10^{12}/$cm$^2$.

4. The semiconductor structure of claim 1, wherein each of the at least first and second dielectric regions further comprises first and second materials.

5. The semiconductor structure of claim 1, wherein said intentionally introduced charges are implanted positive charges.

6. The semiconductor structure of claim 1, wherein said intentionally introduced charges are implanted negative charges.

7. The semiconductor structure of claim 4, wherein the second material in each of the at least first and second dielectric regions comprises aluminum fluoride.

8. The semiconductor structure of claim 4, wherein each of the at least first and second dielectric regions further comprises a third material, said third material being a dielectric material.

9. The semiconductor structure of claim 8, wherein the first and third materials in each dielectric region are the same material.

10. The semiconductor structure of claim 1, wherein said first and second semiconductor regions are respectively p+ type and n+ type regions, said first and second terminals are respectively anode and cathode terminals, and said third semiconductor region is a p-type semiconductor region.

11. The semiconductor structure of claim 10, wherein said third semiconductor region is formed above the second semiconductor region, and said first region is formed above the third semiconductor region.

12. The semiconductor structure of claim 1, wherein said first and second semiconductor regions are respectively p+ type and n+ type regions, said first and second terminals are respectively anode and cathode terminals, and said third semiconductor region is an n-type semiconductor region.

13. The semiconductor structure of claim 12, wherein said third semiconductor region is formed above the second semiconductor region, and said first semiconductor region is formed above the third semiconductor region.

14. The semiconductor structure of claim 1, wherein said at least first and second dielectric regions are isolated from one another.

15. The semiconductor structure of claim 1, wherein said semiconductor structure further comprises a fourth semiconductor region disposed between the second and the third semiconductor regions, said second and fourth semiconductor regions being of the same conductivity type.

16. The semiconductor structure of claim 1, wherein said first and second semiconductor regions are respectively n+ type and p+ type regions, said first and second terminals are respectively cathode and anode terminals, and said third semiconductor region is a p-type region.

17. The semiconductor structure of claim 10, wherein said third semiconductor region is formed above the second semiconductor region and said first semiconductor region is formed above the third semiconductor region.

18. The semiconductor structure of claim 1, wherein said first and second semiconductor regions are respectively n+ type and p+ type regions, said first and second terminals are respectively cathode and anode terminals, and said third semiconductor region is an n-type region.

19. The semiconductor structure of claim 10, wherein said third semiconductor region is formed above the second semiconductor region, and said first semiconductor region is formed above the third semiconductor region.

20. The semiconductor structure of claim 10, wherein each of said at least first and second dielectric regions is tapered so as to have a larger width near one end of the dielectric region than another end of the dielectric region.

21. The semiconductor structure of claim 10, wherein said first, second and third semiconductor regions are formed along the same surface of a semiconductor substrate in which the semiconductor structure is formed.

22. The semiconductor structure of claim 21, further comprising: a fourth semiconductor region in which the second semiconductor region is formed, said third region being adjacent to said first and fourth semiconductor regions.

23. The semiconductor structure of claim 22, wherein said first semiconductor region is a p+ type semiconductor region, said second semiconductor region is an n+ type semiconductor region, said third semiconductor region is a p-type semiconductor region and said fourth semiconductor region is an n-type semiconductor region.

24. The semiconductor structure of claim 22, wherein said first semiconductor region is a p+-type semiconductor region, said second semiconductor region is an n+-type semiconductor region, said third semiconductor region is an n-type region and said fourth semiconductor region is a p-type region.

25. A semiconductor structure comprising:
a first semiconductor region coupled to a first terminal of the structure;
a second semiconductor region coupled to a second terminal of the structure;
a third semiconductor region disposed between the first and second regions;
a fourth semiconductor region extending a first distance along a depth of the third semiconductor region and having a conductivity type opposite a conductivity type of the third semiconductor region, said fourth semiconductor region being adjacent the first and second; and
at least first and second dielectric regions extending a second distance along a depth of the third semiconductor region, wherein said first and second semiconductor regions are of opposite conductivity types, wherein said fourth semiconductor region surrounds a portion of the at least first and second dielectric regions, and wherein said at least first and second dielectric regions or an interface region between each of said at least first and second dielectric regions and said fourth semiconductor regions includes intentionally introduced charges which are immobile at typical device operating temperatures.

26. The semiconductor structure of claim 25, wherein said at least first and second dielectric regions extend into the first and second semiconductor regions.

27. The semiconductor structure of claim 25, wherein each of the at least first and second dielectric regions further comprises first and second materials.

28. The semiconductor structure of claim 25, wherein said intentionally introduced charges are implanted positive charges.

29. The semiconductor structure of claim 25, wherein said intentionally introduced charges are implanted negative charges.

30. The semiconductor structure of claim 27, wherein the second material in each of the at least first and second dielectric regions comprises aluminum fluoride.

31. The semiconductor structure of claim 27, wherein each of the at least first and second dielectric regions further comprises a third material, said third material being a dielectric material.

32. The semiconductor structure of claim 31, wherein the first and third materials in each dielectric region are the same material.

33. The semiconductor structure of claim 25, wherein said first and second semiconductor regions are respectively p+ type and n+ type semiconductor regions, said first and second terminals are respectively anode and cathode terminals, and said third semiconductor region is a p-type region.

34. The semiconductor structure of claim 33, wherein said third semiconductor region is formed above the second semiconductor region and said first semiconductor region is formed above the third semiconductor region.

35. The semiconductor structure of claim 25, wherein said first and second semiconductor regions are respectively p+ type and n+ type semiconductor regions, said first and second terminals are respectively anode and cathode terminals, and said third semiconductor region is an n-type semiconductor region.

36. The semiconductor structure of claim 35, wherein said third semiconductor region is formed above the second semiconductor region and said first semiconductor region is formed above the third semiconductor region.

37. The semiconductor structure of claim 25, wherein said at least first and second dielectric regions are isolated from one another.

38. The semiconductor structure of claim 25, wherein said semiconductor structure further comprises a fifth semiconductor region disposed between the second, the third, and the semiconductor fourth regions, said second and fifth semiconductor regions being of the same conductivity type.

39. The semiconductor structure of claim 25, wherein said first and second semiconductor regions are respectively n+ type and p+ type semiconductor regions, said first and second terminals are respectively cathode and anode terminals, and said third region is a p-type semiconductor region.

40. The semiconductor structure of claim 39, wherein said third semiconductor region is formed above the second semiconductor region, and said first semiconductor region is formed above the third semiconductor region.

41. The semiconductor structure of claim 25, wherein said first and second semiconductor regions are respectively n+ type and p+ type semiconductor regions, said first and second terminals are respectively cathode and anode terminals, and said third semiconductor region is an n-type region.

42. The semiconductor structure of claim 41, wherein said third semiconductor region is formed above the second semiconductor region and said first semiconductor region is formed above the third semiconductor region.

43. The semiconductor structure of claim 25, wherein each of said at least first and second dielectric regions is tapered so as to have a larger width near one end of the dielectric region than another end of the dielectric region.

44. The semiconductor structure of claim 25, wherein said first, second and third semiconductor regions are formed along the same surface of a semiconductor substrate in which the semiconductor structure is formed.

45. The semiconductor structure of claim 44, further comprising: a fifth semiconductor region in which the second semiconductor region is formed, said third semiconductor region being adjacent to said first and fifth semiconductor regions.

46. The semiconductor structure of claim 45, wherein said first semiconductor region is a p+ type semiconductor region, said second semiconductor region is an n+ type semiconductor region, said third semiconductor region is a p-type semiconductor region and said fourth semiconductor region is an n-type semiconductor region.

47. The semiconductor structure of claim 45, wherein said first semiconductor region is a p+-type semiconductor region, said second semiconductor region is an n+-type semiconductor region, said third semiconductor region is an n-type semiconductor region and said fourth semiconductor region is a p-type semiconductor region.

* * * * *